(12) United States Patent
Park et al.

(10) Patent No.: US 11,205,595 B2
(45) Date of Patent: Dec. 21, 2021

(54) METHODS OF FABRICATING SEMICONDUCTOR DEVICES

(71) Applicant: Samsung Electronics Co., Ltd., Suwon-si (KR)

(72) Inventors: Seong-Yul Park, Hwaseong-si (KR); Myoung-Ho Kang, Suwon-si (KR); Hyungkwan Park, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/936,893

(22) Filed: Jul. 23, 2020

(65) Prior Publication Data

US 2021/0175127 A1 Jun. 10, 2021

(30) Foreign Application Priority Data

Dec. 5, 2019 (KR) .......................... 10-2019-0160288

(51) Int. Cl.
*H01L 21/8238* (2006.01)
*H01L 27/092* (2006.01)
(Continued)

(52) U.S. Cl.
CPC ........ *H01L 21/823807* (2013.01); *G03F 1/36* (2013.01); *G06F 30/392* (2020.01); *H01L 21/02532* (2013.01); *H01L 21/02603* (2013.01); *H01L 21/28518* (2013.01); *H01L 21/308* (2013.01); *H01L 21/30604* (2013.01); *H01L 21/823814* (2013.01); *H01L 21/823871* (2013.01); *H01L 27/092* (2013.01); *H01L 29/0673* (2013.01); *H01L 29/42392* (2013.01); *H01L 29/45* (2013.01); *H01L 29/66545* (2013.01); *H01L 29/66742* (2013.01); *H01L 29/78618* (2013.01); *H01L 29/78696* (2013.01)

(58) Field of Classification Search
CPC ....... H01L 21/823807; H01L 21/02532; H01L 21/02603; H01L 21/28518; H01L 21/30604; H01L 21/308; H01L 21/823814; H01L 21/823871; H01L 27/092; H01L 29/0673; H01L 29/42392; H01L 29/45; H01L 29/66545; H01L 29/66742; H01L 29/78618; H01L 29/78696; G06F 30/392; G03F 1/36
USPC ........................................................ 438/154
See application file for complete search history.

(56) References Cited

U.S. PATENT DOCUMENTS 8,869,090 B2 10/2014 Ke et al.
8,987,790 B2 3/2015 Cheng et al.
(Continued)

*Primary Examiner* — Tong-Ho Kim
(74) *Attorney, Agent, or Firm* — Myers Bigel, P.A.

(57) ABSTRACT

A method of fabricating a semiconductor device includes: (i) placing, on a first layout, first patterns that extend parallel to each other in a first direction and are spaced apart from each other in a second direction intersecting the first direction, (ii) extracting a low-density region on the first layout, (iii) defining an enclosure region that surrounds the first patterns, (iv) placing dot patterns on a second layout, (v) extracting, from the dot patterns, first dot patterns that overlap the low-density region and do not overlap the enclosure region, (vi) placing the extracted first dot patterns on the first layout, (vii) allowing the first dot patterns to extend in the first direction to form second patterns, and (viii) using the first and second patterns to respectively form first and second active patterns on a substrate.

19 Claims, 35 Drawing Sheets

(51) Int. Cl.
*H01L 29/06* (2006.01)
*H01L 29/423* (2006.01)
*H01L 29/45* (2006.01)
*H01L 29/786* (2006.01)
*H01L 21/02* (2006.01)
*H01L 21/285* (2006.01)
*H01L 21/306* (2006.01)
*H01L 21/308* (2006.01)
*H01L 29/66* (2006.01)
*G06F 30/392* (2020.01)
*G03F 1/36* (2012.01)

(56) References Cited

U.S. PATENT DOCUMENTS

| | | |
|---|---|---|
| 9,012,287 B2 | 4/2015 | Liaw |
| 10,049,178 B2 | 8/2018 | Wang et al. |
| 10,128,243 B2 | 11/2018 | Yoo et al. |
| 10,185,798 B2 | 1/2019 | Kim et al. |
| 2007/0059610 A1* | 3/2007 | Jeong ............... G03F 1/36 430/5 |
| 2008/0315323 A1* | 12/2008 | Moon ............... G03F 1/36 257/390 |
| 2013/0017474 A1* | 1/2013 | Chiang ............. G03F 1/36 430/5 |
| 2017/0017745 A1* | 1/2017 | Wang ............. H01L 21/823431 |
| 2018/0341736 A1 | 11/2018 | Chen et al. |
| 2019/0148235 A1 | 5/2019 | Wang |
| 2020/0395354 A1* | 12/2020 | Lee ................. G06F 30/398 |

* cited by examiner

METHODS OF FABRICATING SEMICONDUCTOR DEVICES

REFERENCE TO PRIORITY APPLICATION

This U.S. nonprovisional application claims priority under 35 U.S.C § 119 to Korean Patent Application No. 10-2019-0160288, filed Dec. 5, 2019 in the Korean Intellectual Property Office, the disclosure of which is hereby incorporated herein by reference.

BACKGROUND

The present inventive concepts relate to semiconductor devices and, more particularly, to semiconductor devices including field effect transistors and methods of fabricating the same.

Semiconductor devices are beneficial in the electronic industry because of their small size, multi-functionality, and/or low fabrication cost. Semiconductor devices may include such devices as semiconductor memory devices, which store logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly used because of their high reliability, high speed, and/or multi-functionality. Semiconductor devices have been made more complicated and more highly integrated to meet these required characteristics.

SUMMARY

Some example embodiments of the present inventive concepts include methods of fabricating semiconductor devices with improved electrical characteristics.

According to some example embodiments of the present inventive concepts, a method of fabricating a semiconductor device may include: (i) placing on a first layout a plurality of first patterns that extend parallel to each other in a first direction and are spaced apart from each other in a second direction, (ii) extracting a low-density region on the first layout where the first patterns are placed, (iii) defining an enclosure region that surrounds at least some of the first patterns on the first layout, (iv) placing a plurality of dot patterns on a second layout, (v) extracting a plurality of first dot patterns from the dot patterns on the second layout, which overlap the low-density region but not the enclosure region, (vi) placing the extracted first dot patterns on the first layout, (vii) extending the first dot patterns in the first direction to form a plurality of second patterns therefrom, and (viii) forming a plurality of first active patterns and a plurality of second active patterns on a substrate, from the first patterns and the second patterns, respectively.

According to some example embodiments of the present inventive concepts, a method of fabricating a semiconductor device may include designing a layout, and generating a photomask based on the layout. The generated photomask is then used to form a plurality of active patterns on a substrate. A step(s) of designing the layout may include: (i) placing on the layout a plurality of first patterns that extend parallel to each other in a first direction, with the layout including a low-density region where the first patterns are not placed; and (ii) placing on the low-density region a plurality of second patterns that extend parallel to each other in the first direction. A step(s) of forming the active patterns may include using the first patterns and the second patterns of the layout to respectively form a plurality of first active patterns and a plurality of second active patterns on the substrate.

DETAILED DESCRIPTION OF EMBODIMENTS

Figure 1:
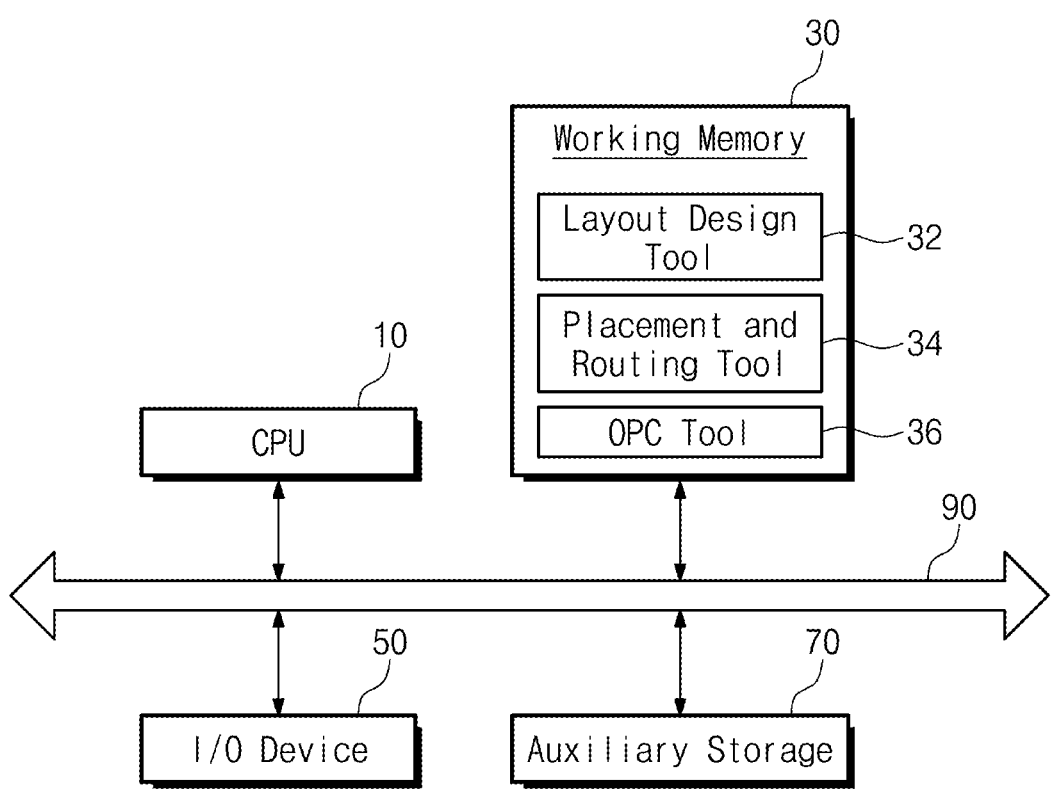
FIG. 1 illustrates a block diagram showing a computer system for semiconductor design according to some example embodiments of the present inventive concepts.

FIG. 1 illustrates a block diagram showing a computer system for semiconductor design according to some example embodiments of the present inventive concepts. Referring to FIG. 1, a computer system may include a central processing unit (CPU) 10, a working memory 30, an input/output (I/O) device 50, and an auxiliary storage 70. The computer system may be provided as a dedicated device for designing a layout according to the present inventive concepts. The computer system may be configured to drive various programs for design and verification simulation.

The CPU 10 may allow the computer system to execute software (e.g., application programs, operating system, and device drivers). The CPU 10 may process an operating system loaded in the working memory 30. The CPU 10 may execute various application programs driven based on the operating system. For example, the CPU 10 may process a layout design tool 32, a placement-and-routing tool 34, and/or an OPC (Optical Proximity Correction) tool 36 that are loaded in the working memory 30.

The operating system or application programs may be loaded in the working memory 30. When the computer system is booted up, based on booting sequence, an operating system image (not shown) stored in the auxiliary storage 70 may be loaded to the working memory 30. Overall input/output operations of the computer system may be supported by the operating system. Likewise, the working memory 30 may be loaded with the application programs that are selected by a user or provided for basic services.

The layout design tool 32 for layout design may be loaded from the auxiliary storage 70 to the working memory 30. The working memory 30 may be loaded from the auxiliary storage 70 with the placement-and-routing tool 34 that places designed standard cells, rearranges inner line patterns in the placed standard cells, and routes the placed standard cells. The working memory 30 may be loaded from the auxiliary storage 70 with the OPC tool 36 that performs an optical proximity correction (OPC) on designed layout data.

The layout design tool 32 may include a bias function by which specific layout patterns are changed in shapes and positions defined by a design rule. In addition, the layout design tool 32 may perform a design rule check (DRC) under the changed bias data condition. The working memory 30 may be either a volatile memory such as static random access memory (SRAM) or dynamic random access memory (DRAM) or a nonvolatile memory such as phase change random access memory (PRAM), magnetic random access memory (MRAM), resistance random access memory (ReRAM), ferroelectric random access memory (FRAM), or NOR Flash memory.

The I/O device 50 may control user input/output operations of user interfaces. For example, the I/O device 50 may include a keyboard or a monitor, allowing a designer to input relevant information. The user may use the I/O device 50 to receive information about a semiconductor region or data paths requiring adjusted operating characteristics. The I/O device 50 may display a progress status or a process result of the OPC tool 36.

The auxiliary storage 70 may serve as a storage medium for the computer system. The auxiliary storage 70 may store the application programs, the operating system image, and various data. The auxiliary storage 70 may be provided in the form of one of memory cards (e.g., MMC, eMMC, SD, and Micro SD) and a hard disk drive (HDD). The auxiliary storage 70 may include a NAND Flash memory having large memory capacity. Alternatively, the auxiliary storage 70 may include a NOR Flash memory or a next-generation volatile memory such as PRAM, MRAM, ReRAM, and FRAM.

A system interconnector 90 may be provided to serve as a system bus for providing a network in the computer system. The CPU 10, the working memory 30, the I/O device 50, and the auxiliary storage 70 may be electrically connected through the system interconnector 90 and may exchange data with each other. The system interconnector 90 is not limited to the above description, and may further include intermediary means for efficient management.

Figure 2:
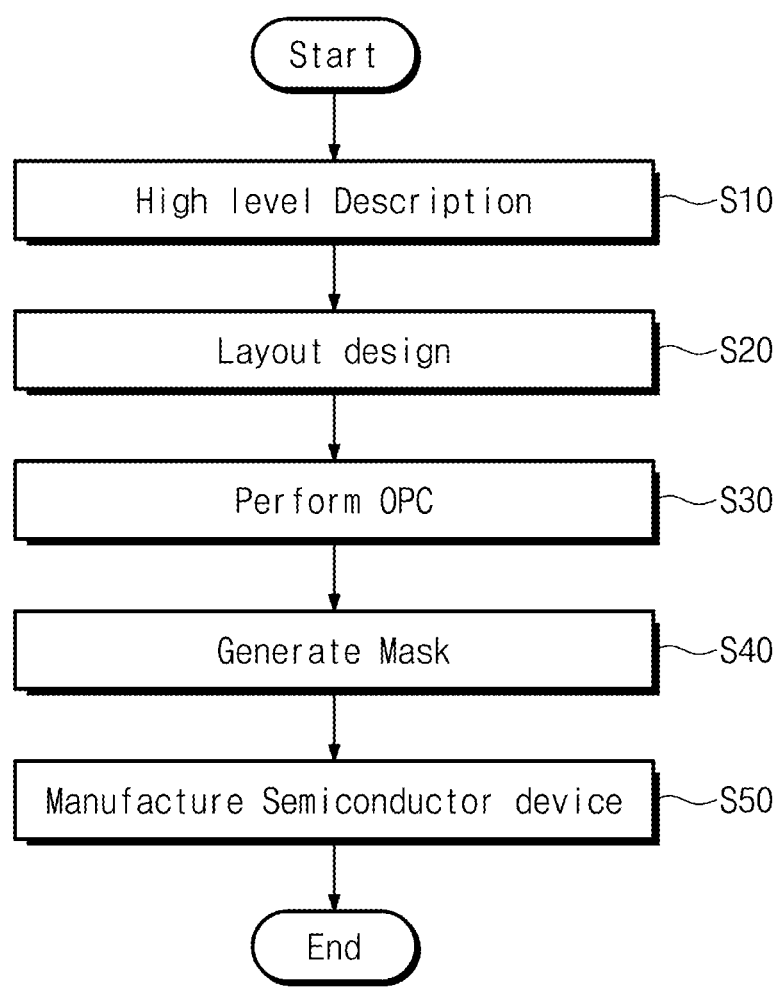
FIG. 2 illustrates a flow chart showing a method of designing and fabricating a semiconductor device according to some example embodiments of the present inventive concepts.

FIG. 2 illustrates a flow chart showing a method of designing and fabricating a semiconductor device according to some example embodiments of the present inventive concepts. Referring to FIG. 2, a high-level design of a semiconductor integrated circuit may be performed using the computer system discussed with reference to FIG. 1 (S10). The high-level design may mean that an integrated circuit corresponding to a design target is described with a high-level language of a hardware description language (HDL). For example, the high-level language such as C language may be used in the high-level design. A register transfer level (RTL) coding or simulation may be used to express in detail circuits designed by the high-level design. In addition, codes created by the RTL coding may be converted into a netlist, which may be synthesized to describe an entire semiconductor device. The synthesized schematic circuit may be verified by a simulation tool, and an adjustment process may be performed based on the verified result.

A layout design may be performed to implement on a silicon substrate a semiconductor integrated circuit that is logically completed (S20). For example, the layout design step may be performed based on the schematic circuit synthesized in the high-level design step or the netlist corresponding to the schematic circuit. The layout design step may include a routing step that places and connects various standard cells provided from a cell library, based on a prescribed design rule.

A cell library for the layout design may include information about operation, speed, and power consumption of the standard cell. The cell library for representing a layout of a specific gate-level circuit as a layout may be defined in the layout design tool. The layout may be prepared to define shapes or dimensions of patterns constituting transistors and metal lines that will be actually formed on a silicon substrate. For example, in order to actually form an inverter circuit on a silicon substrate, it may be necessary to appropriately place or describe layout patterns such as PMOS, NMOS, N-WELL, gate electrodes, and metal lines thereon. For this, a search may be first performed to select a suitable one of inverters predefined in the cell library.

A routing step may be performed on the selected and placed standard cells. In detail, high-level lines (routing patterns) may be provided on the placed standard cells. The standard cells may connected to each other through the routing step. The placement and routing of the standard cells may be automatically performed by the placement-and-routing tool 34.

After the routing step, a verification step may be performed on the layout to check whether the layout violates the given design rule. The verification step may include a design rule check (DRC) for verifying whether the layout meets the given design rule, an electrical rule check (ERC) for verifying whether there is an issue of an electrical disconnection in the layout, and a layout vs. schematic (LVS) comparison for verifying whether the layout agrees with the gate-level netlist.

An optical proximity correction (OPC) step may be performed (S30). A photolithography process may be employed to achieve on a silicon substrate the layout patterns obtained by the layout design step. The optical proximity correction process may be a technique for correcting an unintended optical effect occurring in the photolithography process. For example, the optical proximity correction process may correct an undesirable phenomenon such as refraction or process side effects caused by characteristics of light in an exposure process using the layout patterns. When the optical proximity correction step is performed, the designed layout patterns may be slightly changed (or biased) in shapes and positions.

A photomask may be generated based on the layout changed by the optical proximity correction step (S40). The photomask may generally be manufactured by describing the layout patterns using a chromium layer coated (and patterned) on a glass substrate.

The generated photomask may be used to manufacture a semiconductor device (S50). Various exposure and etching processes may be repeatedly performed in manufacturing the semiconductor device using the photomask. Through these processes discussed above, patterns defined in the layout design may be sequentially formed on a silicon substrate.

Figure 3:
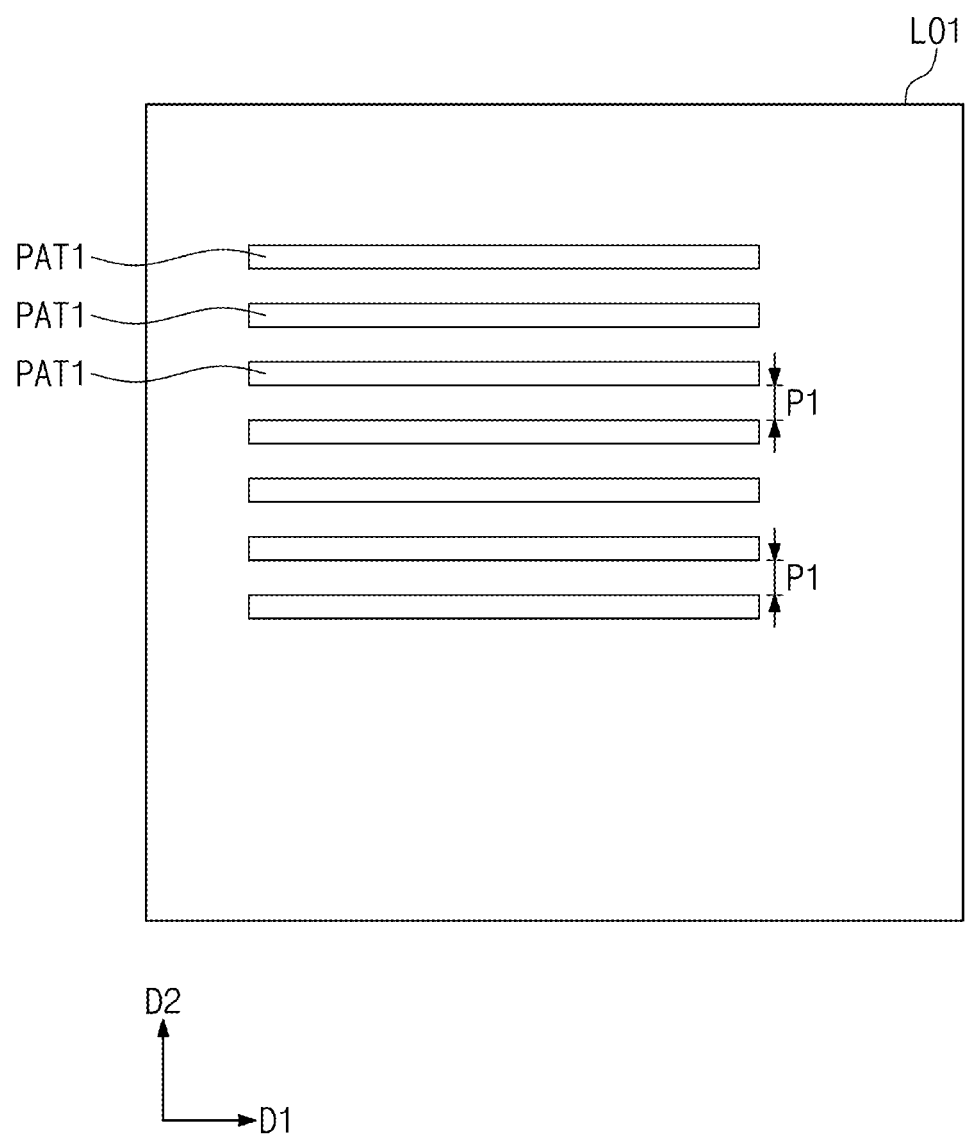
FIGS. 3 to 5, 11, and 13 illustrate layout diagrams showing in detail a first layout according to some example embodiments of the present inventive concepts.
Figure 4:
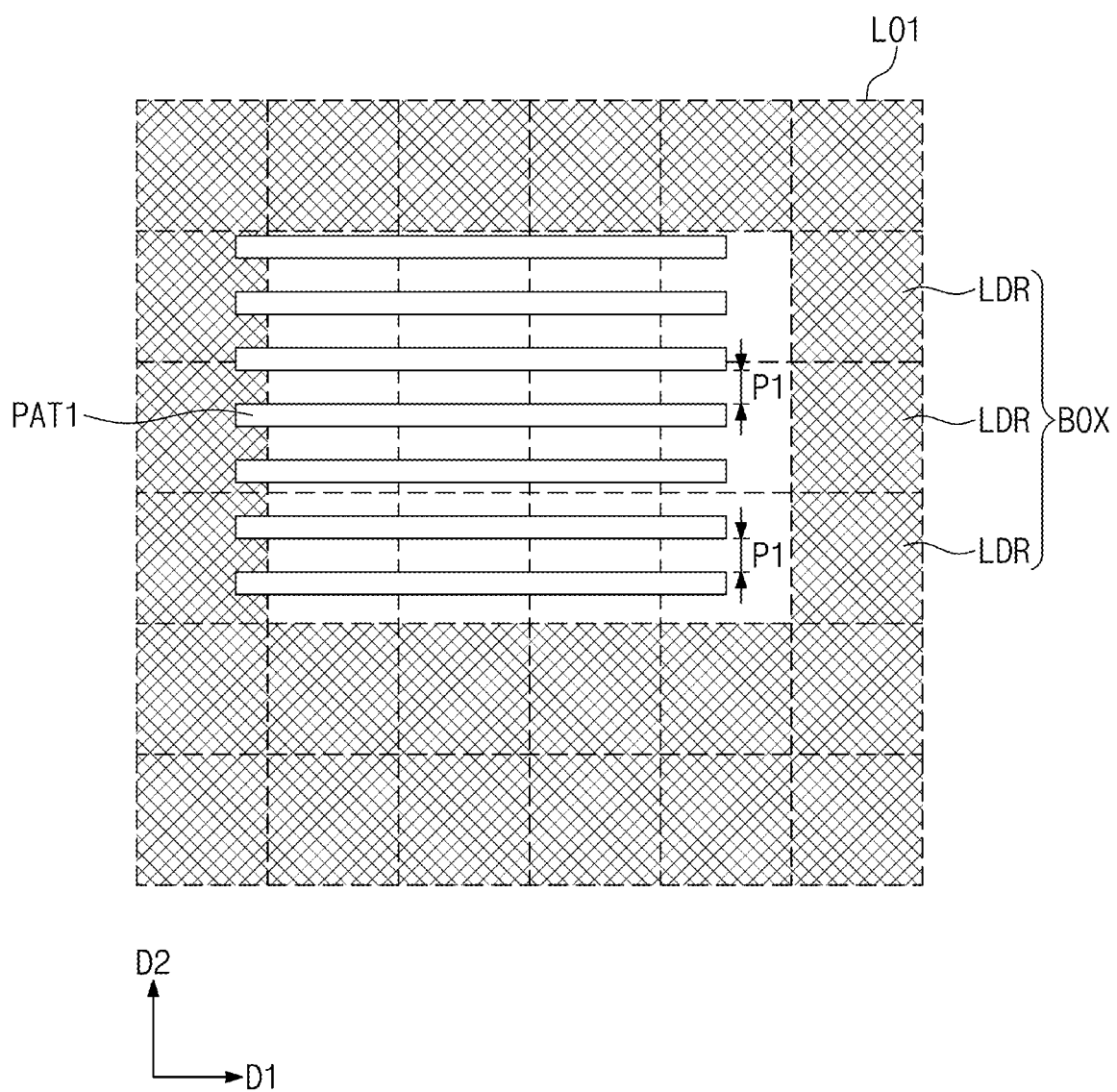
Figure 5:
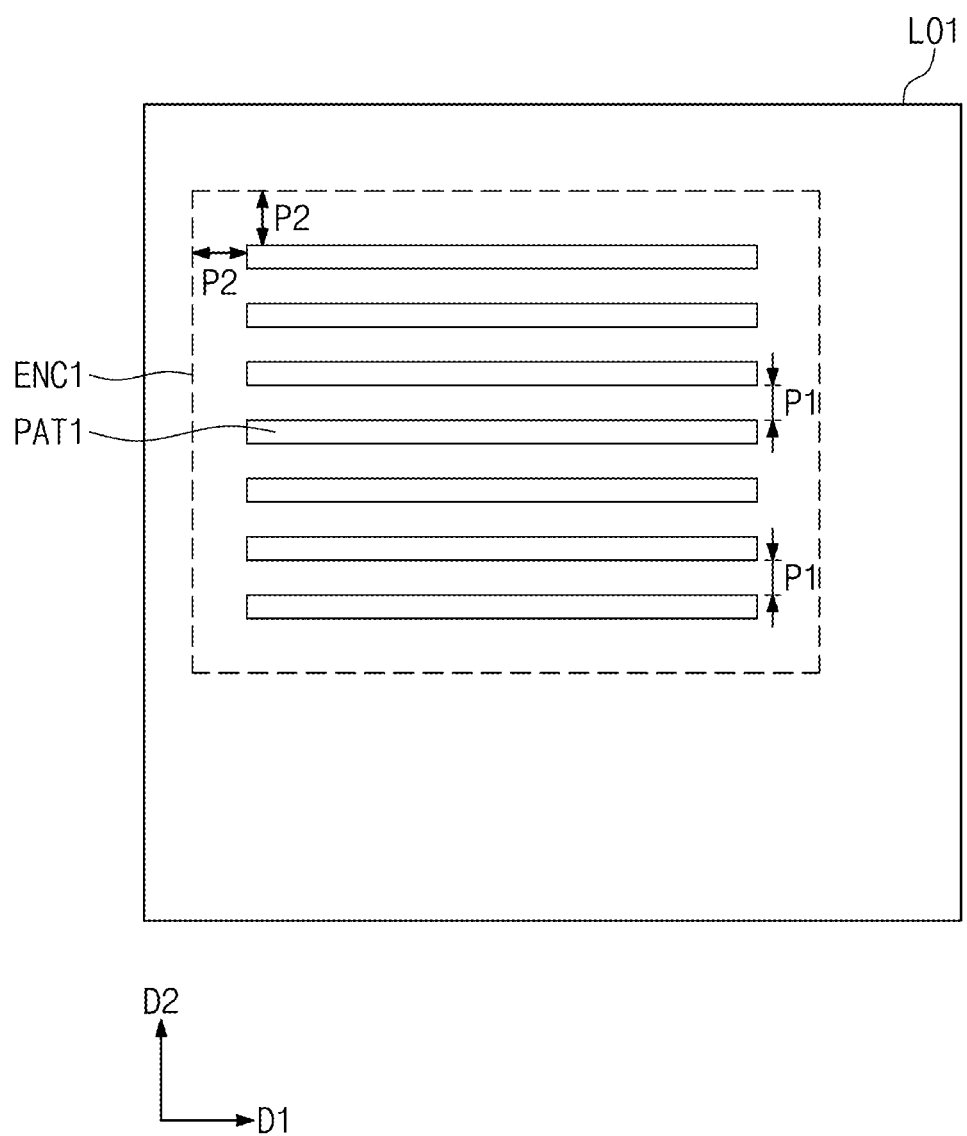

FIGS. 3 to 5 illustrate layout diagrams showing in detail a first layout according to some example embodiments of the present inventive concepts. Referring to FIG. 3, a first layout LO1 may be provided. First patterns PAT1 may be formed on the first layout LO1. The first patterns PAT1 may have their linear or bar shapes that extend parallel to each other in a first direction D1. The first patterns PAT1 may be spaced apart from each other in a second direction D2 that intersects the first direction D1. The first patterns PAT1 may be arranged in the second direction D2. A first distance P1 may be provided between the first patterns PAT1 that are adjacent to each other. Herein, the term "distance" may indicate a minimum distance in the second direction D2 between a side of one first pattern PAT1 and a side of another first pattern PAT1 adjacent to the one first pattern PAT1.

Referring to FIG. 4, a low-density region LDR may be extracted on the first layout LO1. For example, the first layout LO1 may be divided into a plurality of sections BOX. Among the plurality of sections BOX, a section where a density of the first patterns PAT1 is equal to or less than a certain value may be extracted as the low-density region LDR. For example, the low-density region LDR may be a section where any first pattern PAT1 is not disposed at all. For another example, the low-density region LDR may be a section where an area ratio of the first pattern PAT1 to the section BOX is equal to or less than about 20%. The ratio may be defined as a pattern density. For example, the low-density region LDR may be a section whose pattern density of the first pattern PAT1 is relatively low (e.g., about 20% or less).

Referring to FIG. 5, on the first layout LO1, an enclosure region ENC1 may be defined to surround the first patterns PAT1. The enclosure region ENC1 may be defined to refer to a section into which all of the first patterns PAT1 are introduced. A second distance P2 may be provided between a boundary of the enclosure region ENC1 and one first pattern PAT1 adjacent to the boundary, and the second distance P2 may be greater than the first distance P1 between the first patterns PAT1.

Figure 6:
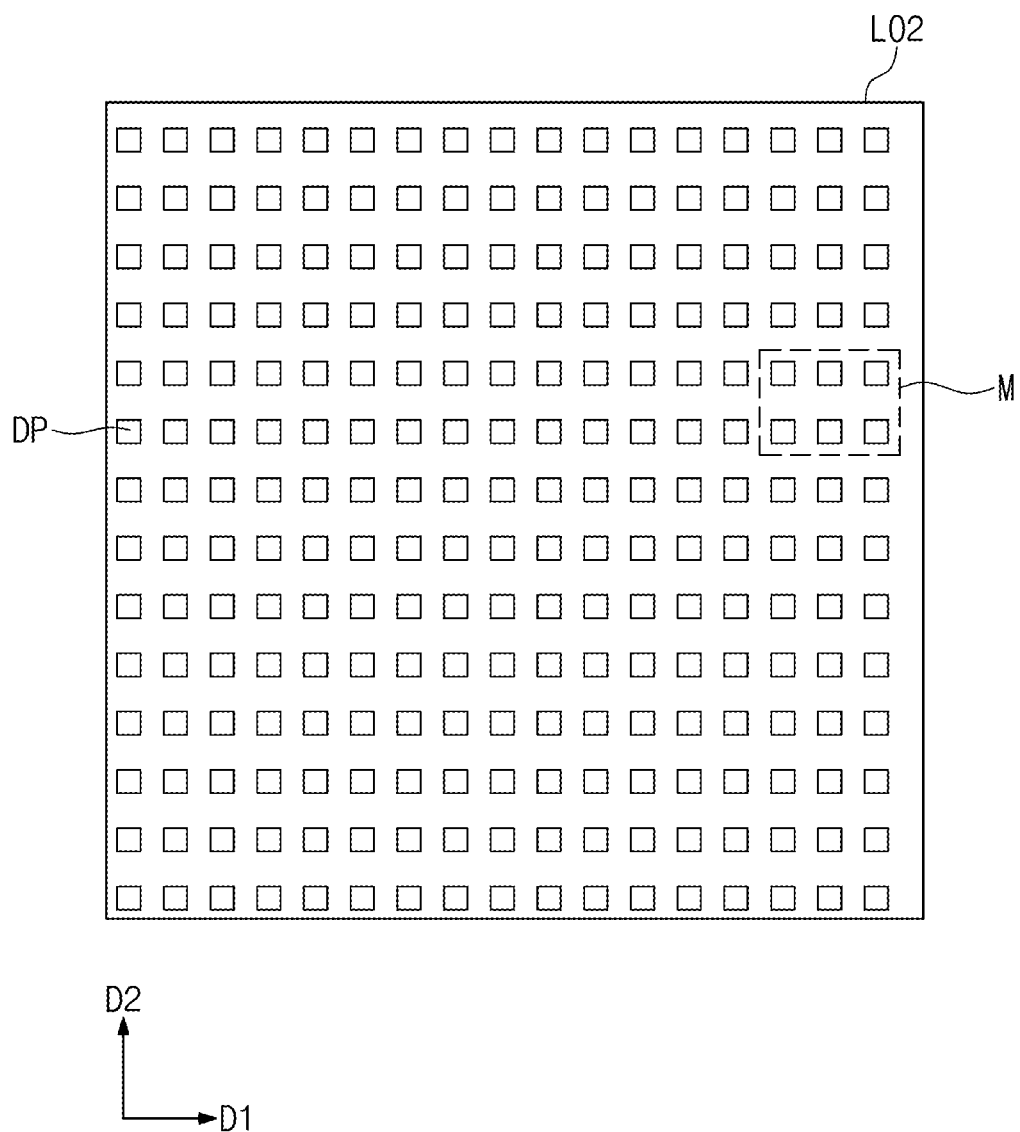
FIGS. 6 and 8 to 10 illustrate layout diagrams showing in detail a second layout according to some example embodiments of the present inventive concepts.
Figure 7:
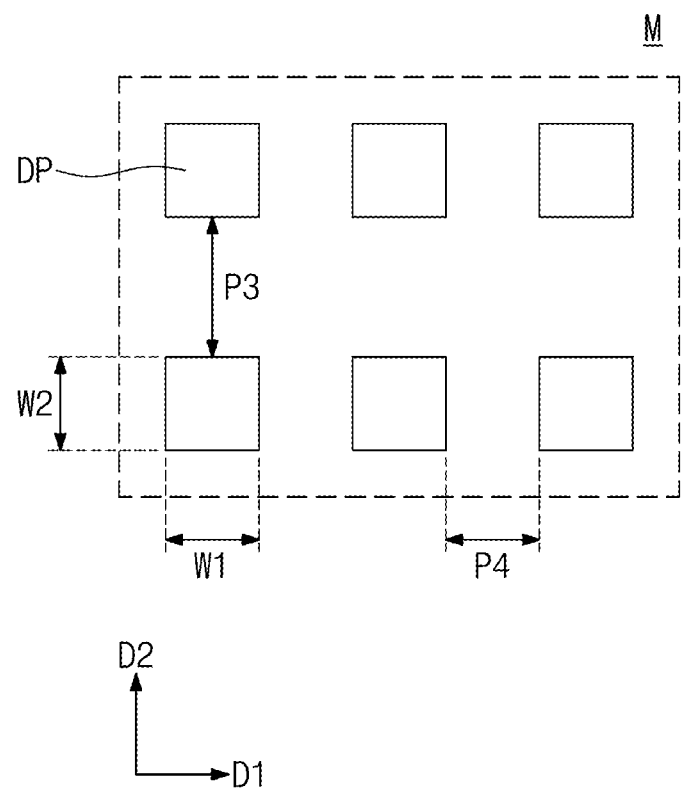
FIG. 7 illustrates an enlarged view showing section M of FIG. 6.

FIGS. 6 and 8 to 10 illustrate layout diagrams showing in detail a second layout according to some example embodiments of the present inventive concepts. FIG. 7 illustrates an enlarged view showing section M of FIG. 6. Referring to FIGS. 6 and 7, a second layout LO2 may be provided. Dot patterns DP may be formed on the second layout LO2. The dot patterns DP may be two-dimensionally arranged along the first and second directions D1 and D2 on the second layout LO2. Each of the dot patterns DP may have a length W1 in the first direction D1 and a length W2 in the second direction D2, which lengths W1 and W2 are substantially the same as each other.

A third distance P3 may be provided between the dot patterns DP that are adjacent to each other in the second direction D2. A fourth distance P4 may be provided between the dot patterns DP that are adjacent to each other in the first direction D1. Herein, the term "distance" may denote a minimum distance between a side of one dot pattern DP and a side of another dot pattern DP adjacent to the one dot pattern DP. For example, the third distance P3 may be greater than the fourth distance P4.

Figure 8:
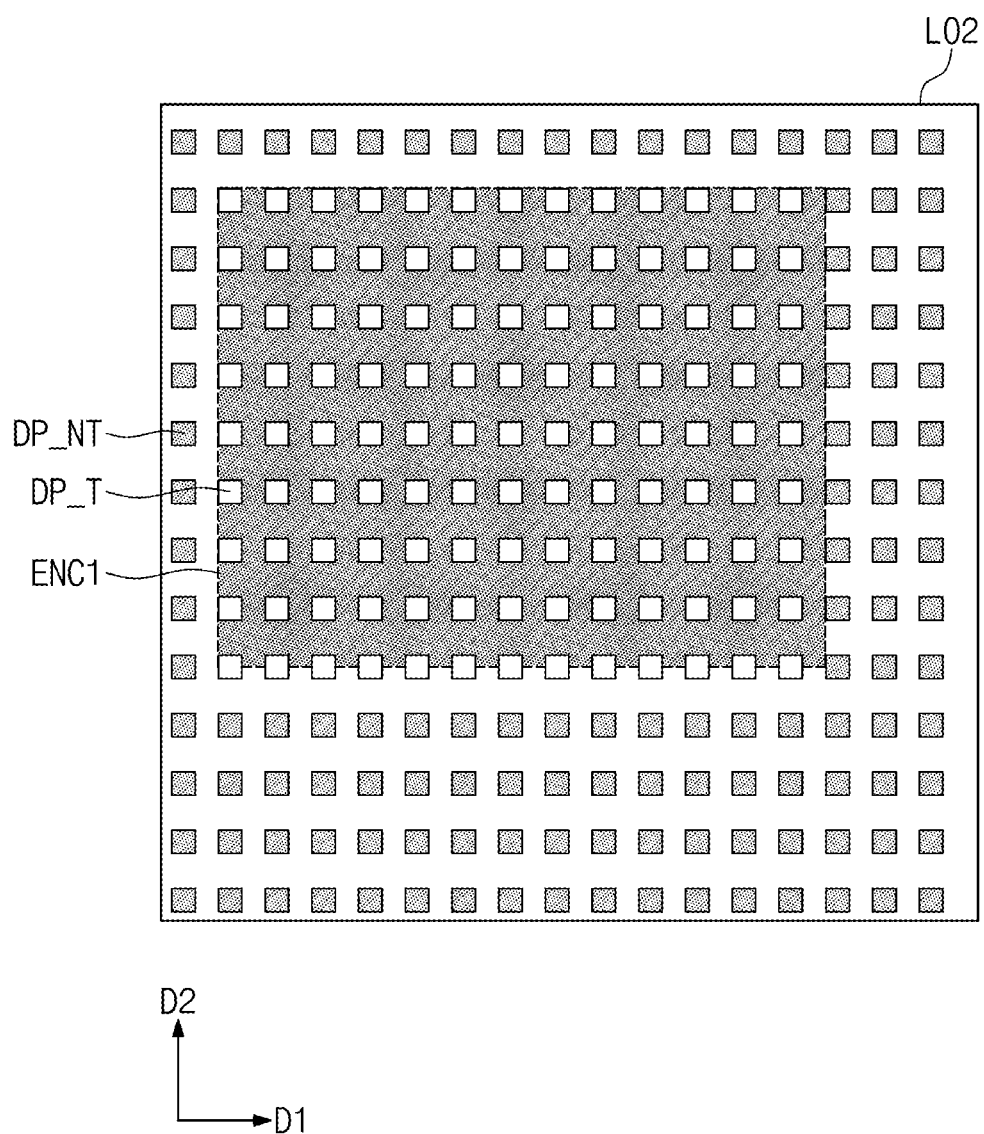
Figure 9:
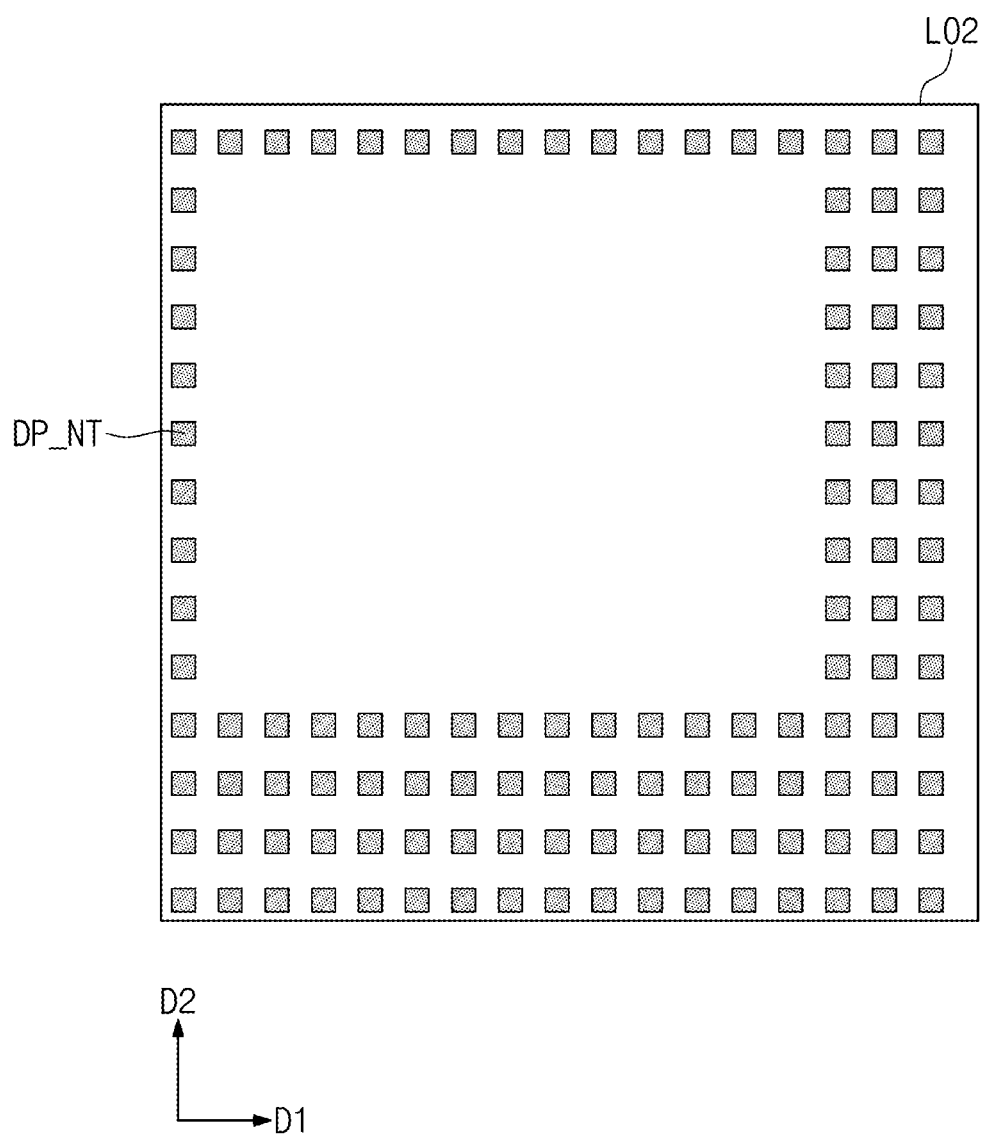

Referring to FIGS. 8 and 9, the dot patterns DP on the second layout LO2 may be divided into patterns DP_T that overlap the enclosure region ENC1 on the first layout LO1 and patterns DP_NT that do not overlap the enclosure region ENC1 on the first layout LO1. As shown in FIG. 9, on the second layout LO2, the patterns DP_NT may be selectively extracted which do not overlap the enclosure region ENC1 on the first layout LO1.

Figure 10:
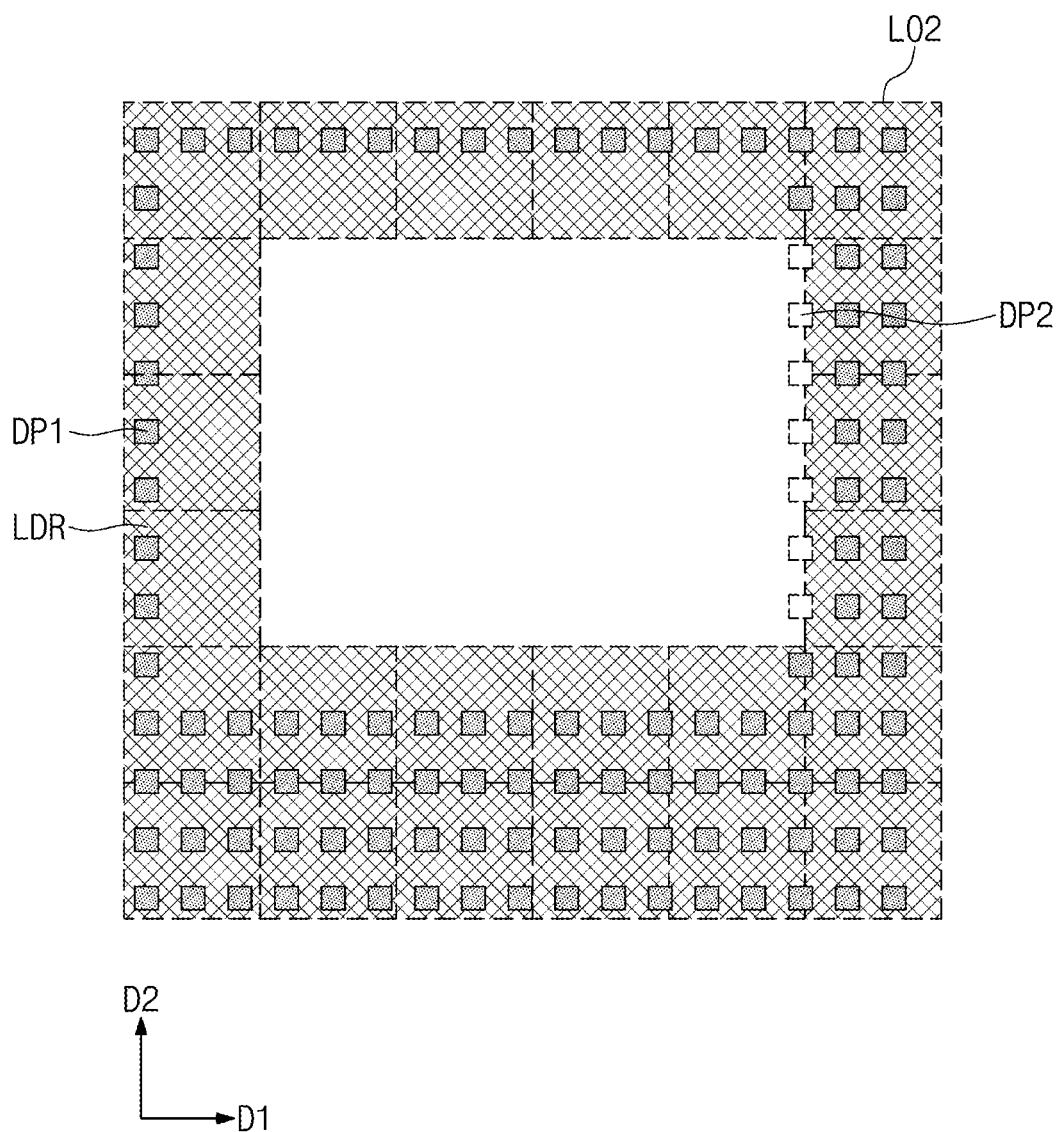

Referring to FIG. 10, among the patterns DP_NT that do not overlap the enclosure region ENC1, a first dot pattern DP1 may be extracted which overlaps the low-density region LDR that is extracted on the first layout LO1. Among a plurality of first dot patterns DP1, a dot pattern DP2 may be excluded which does not entirely overlap the low-density region LDR.

Figure 11:
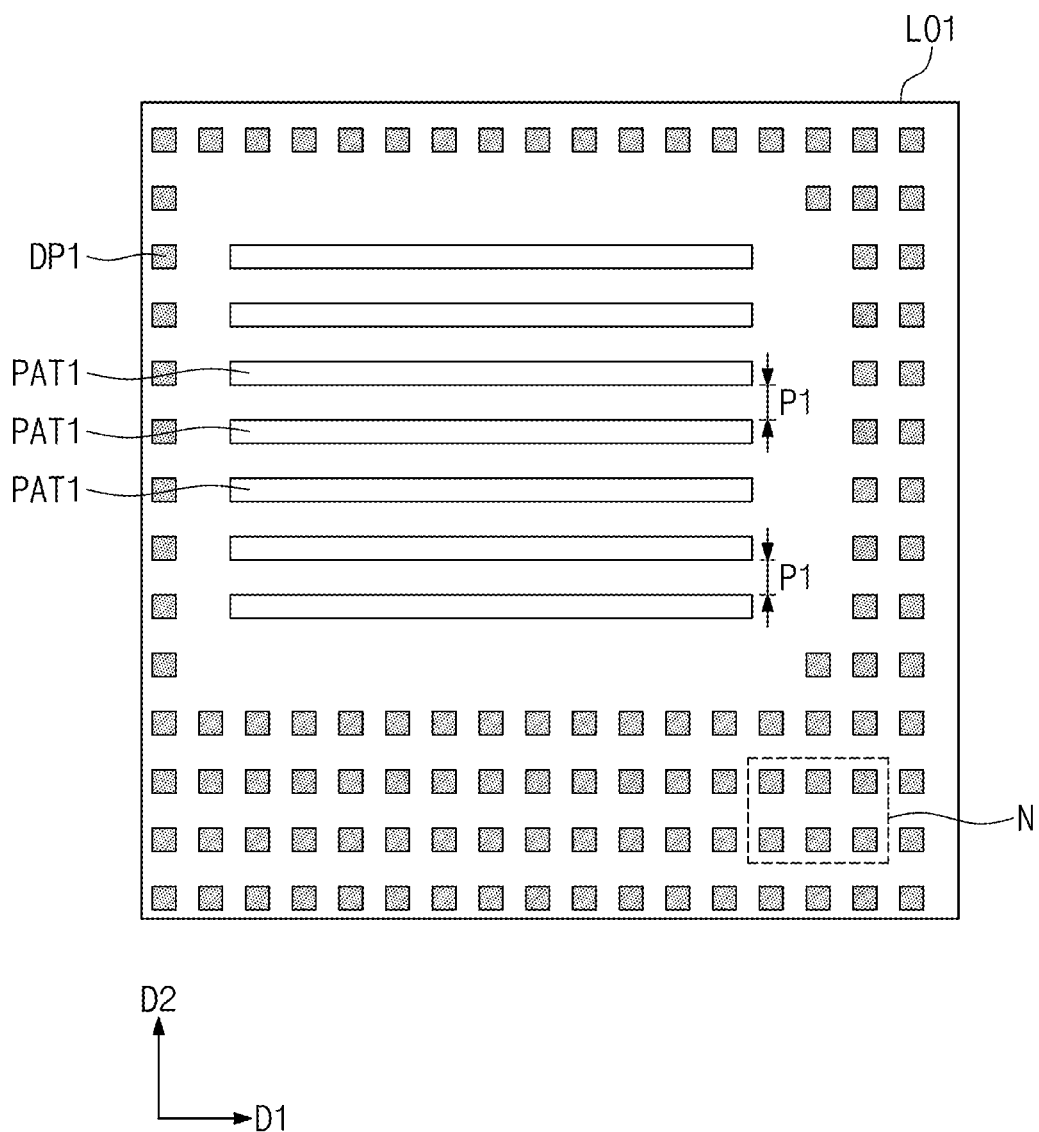
Figure 12:
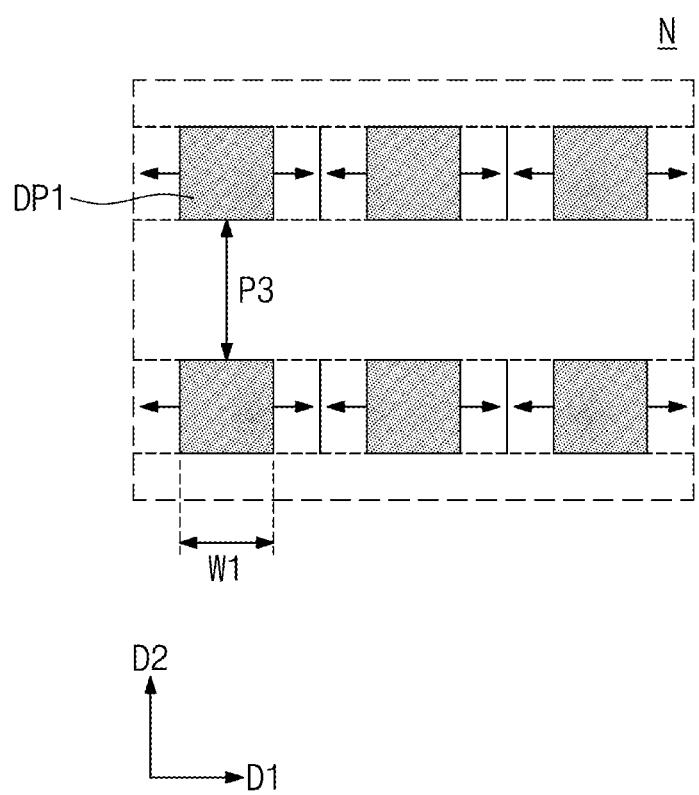
FIG. 12 illustrates an enlarged view showing section N of FIG. 11.
Figure 13:
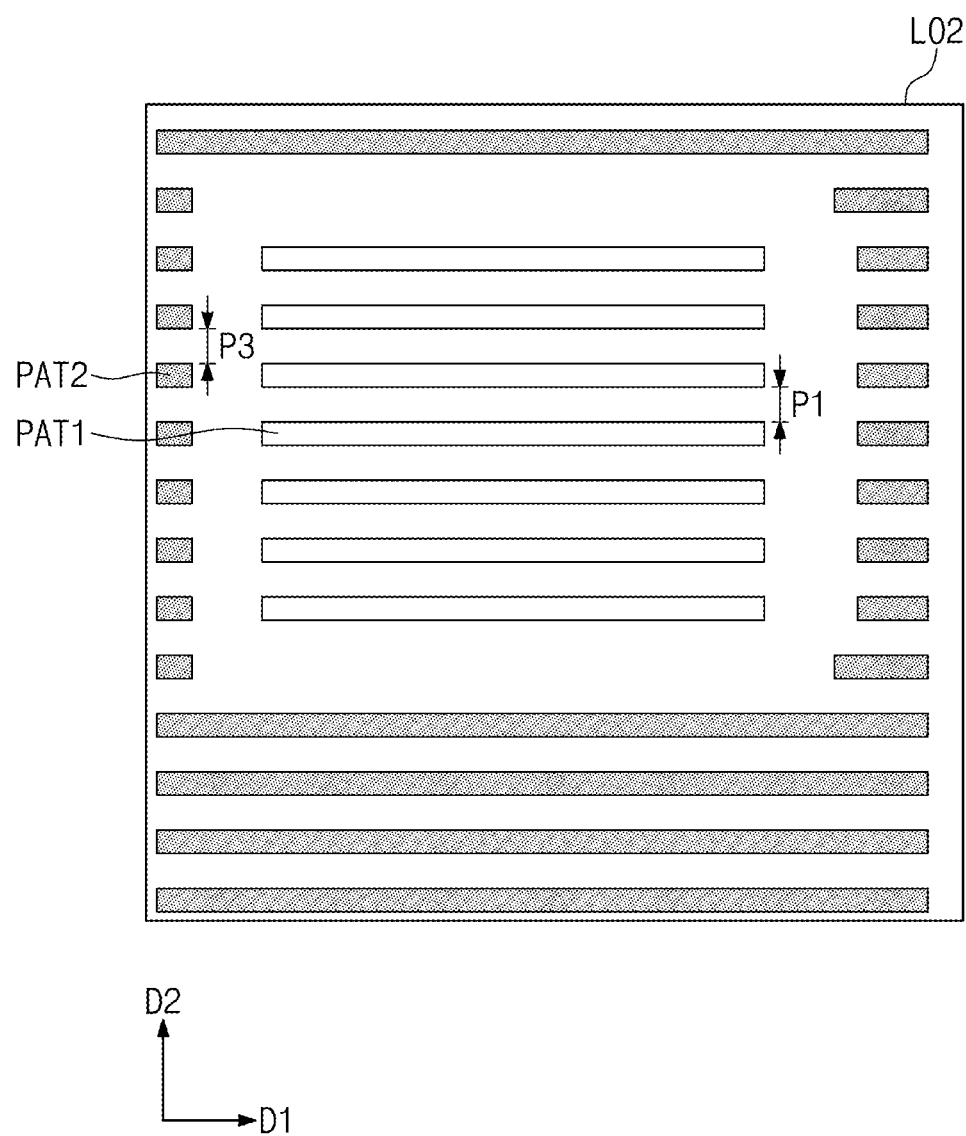

FIGS. 11 and 13 illustrate layout diagrams showing in detail a first layout according to some example embodiments of the present inventive concepts. FIG. 12 illustrates an enlarged view showing section N of FIG. 11. Referring to FIGS. 11 to 13, the first dot patterns DP1 extracted from the second layout LO2 may be disposed on the first layout LO1. Afterwards, the first dot patterns DP1 may extend in the first direction D1 to form second patterns PAT2. The second patterns PAT2 may have their linear or bar shapes that extend parallel to each other in the first direction D1. The second patterns PAT2 may be arranged in the second direction D2. A distance between a side of one second pattern PAT2 and a side of another second pattern PAT2 adjacent to the one second pattern PAT2 may be substantially the same as the third distance P3 in the second direction D2 between the dot patterns DP discussed above.

Figure 14:
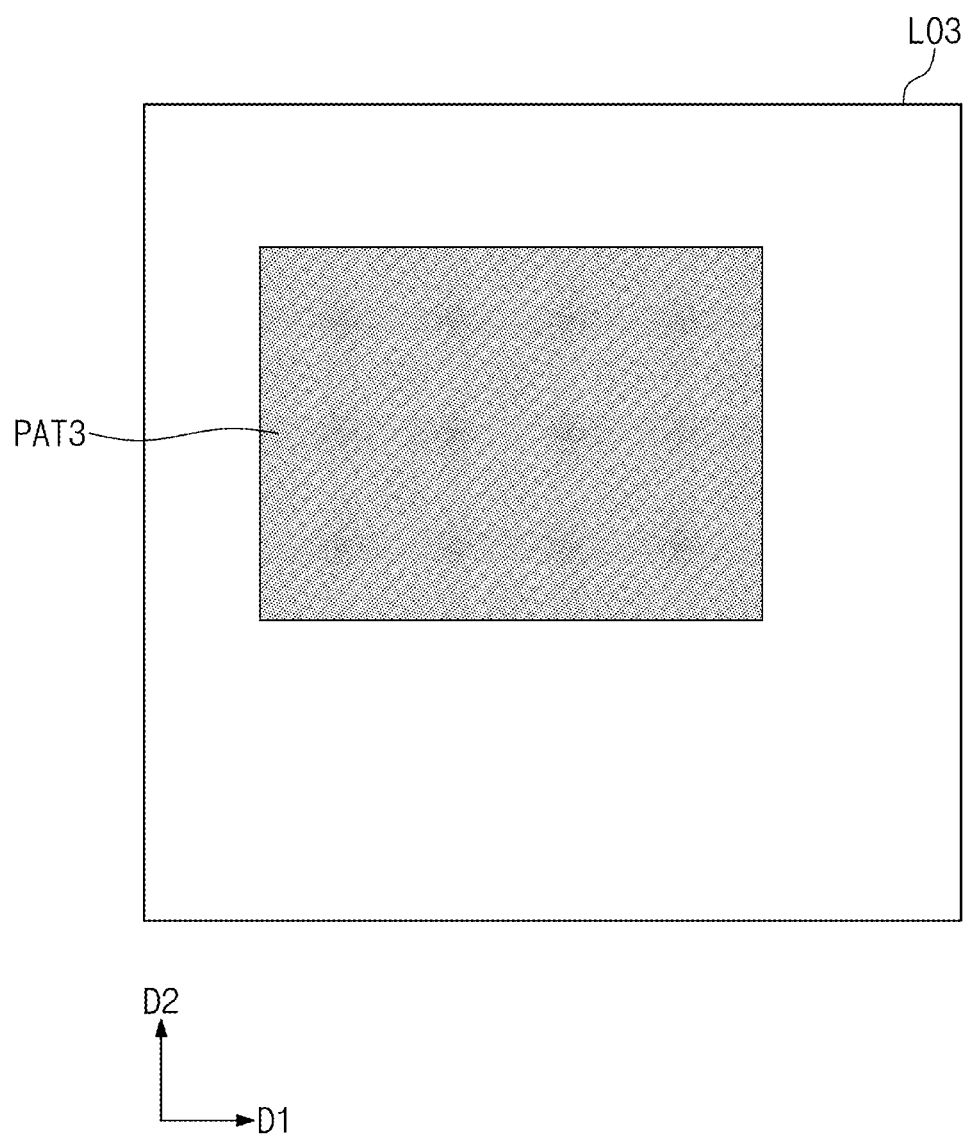
FIG. 14 illustrates a layout diagram showing in detail a third layout according to some example embodiments of the present inventive concepts.

FIG. 14 illustrates a layout diagram showing in detail a third layout according to some example embodiments of the present inventive concepts. Referring to FIG. 14, a third layout LO3 may be provided. Third patterns PAT3 may be formed on the third layout LO3. The third pattern PAT3 may cover the first pattern PAT1 on the first layout LO1. For example, the third pattern PAT3 may have a size substantially the same as that of the enclosure region ENC1.

Figure 15:
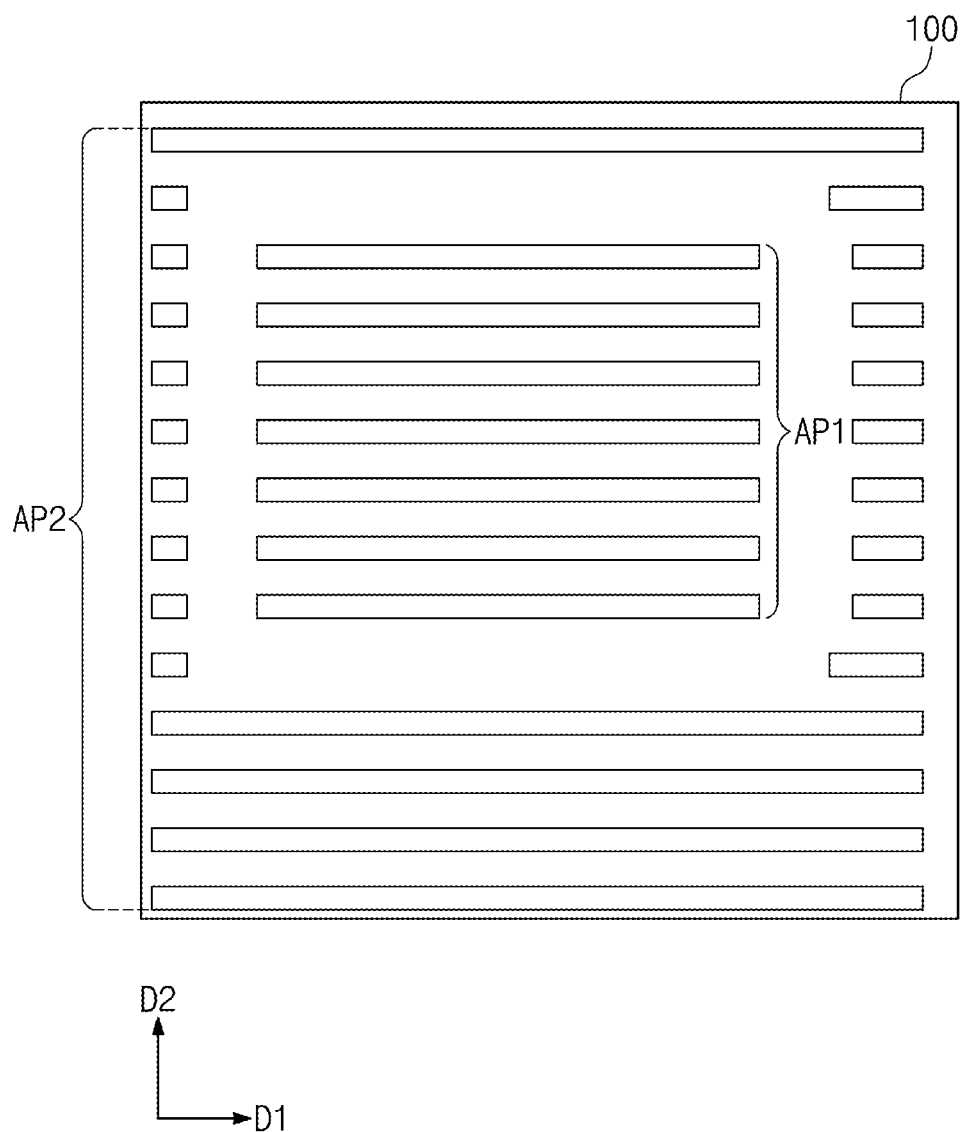
FIGS. 15 and 16 illustrate plan views showing a semiconductor device formed on a substrate based on the layouts of FIGS. 13 and 14, respectively.
Figure 16:
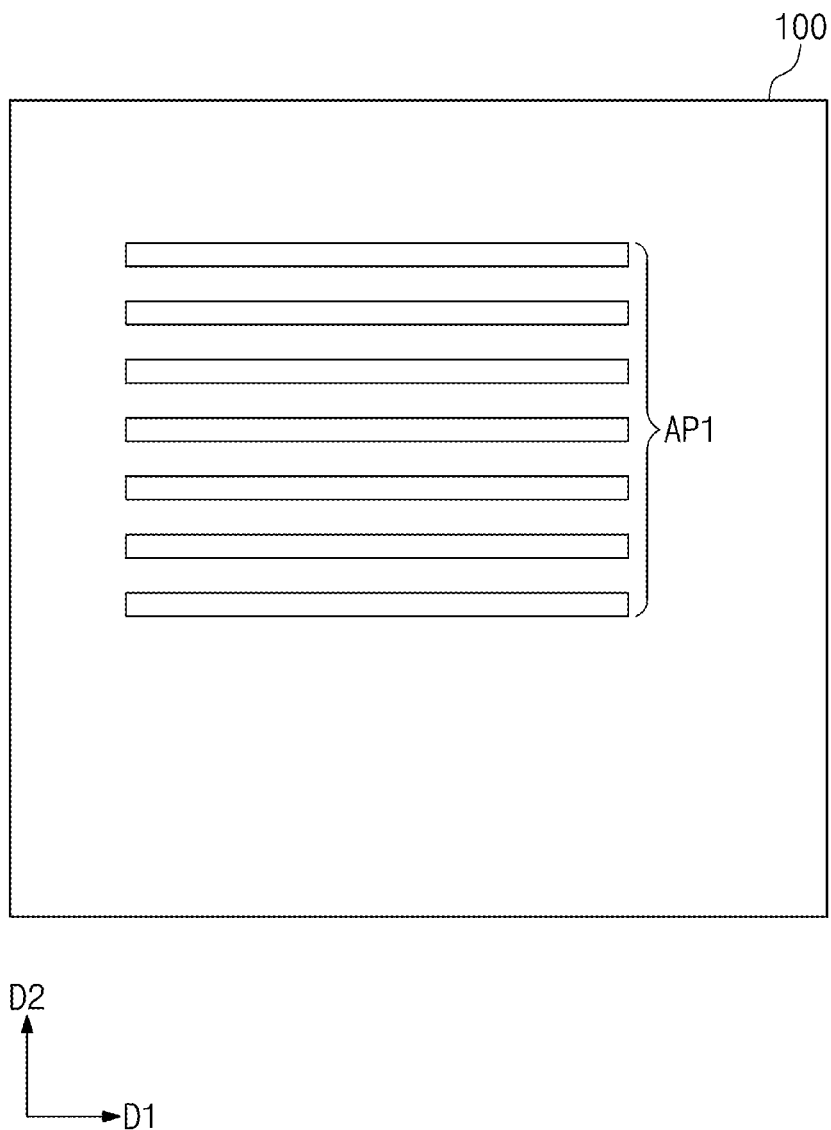

FIGS. 15 and 16 illustrate plan views showing a semiconductor device formed on a substrate based on the layouts of FIGS. 13 and 14, respectively. Referring to FIG. 15, a substrate 100 may be provided. A first photomask may be manufactured by using the first layout LO1 where the first patterns PAT1 and the second patterns PAT2 are formed. The first photomask may be used to perform a photolithography process in which the substrate 100 is patterned to form first active patterns AP1 and the second active patterns AP2.

Referring to FIG. 16, an etching process may be performed to remove the second active patterns AP2. For example, a second photomask may be manufactured by using the third layout LO3 where the third pattern PAT3 is formed. The second photomask may be used to perform a photolithography process on the substrate 100, and then an etching process may be performed to remove the second active patterns AP2.

As discussed above, a method of fabricating a semiconductor device according to the present inventive concepts may include extracting the low-density region LDR on a layout, and forming the second patterns PAT2 on the low-density region LDR. When the second patterns PAT2 are used to form the second active patterns AP2 on the substrate 100 and then an etching process is performed, it may be possible to uniformly form the first active patterns AP1 used for an actual semiconductor device and to improve electrical characteristics of the semiconductor device.

Figure 22A:
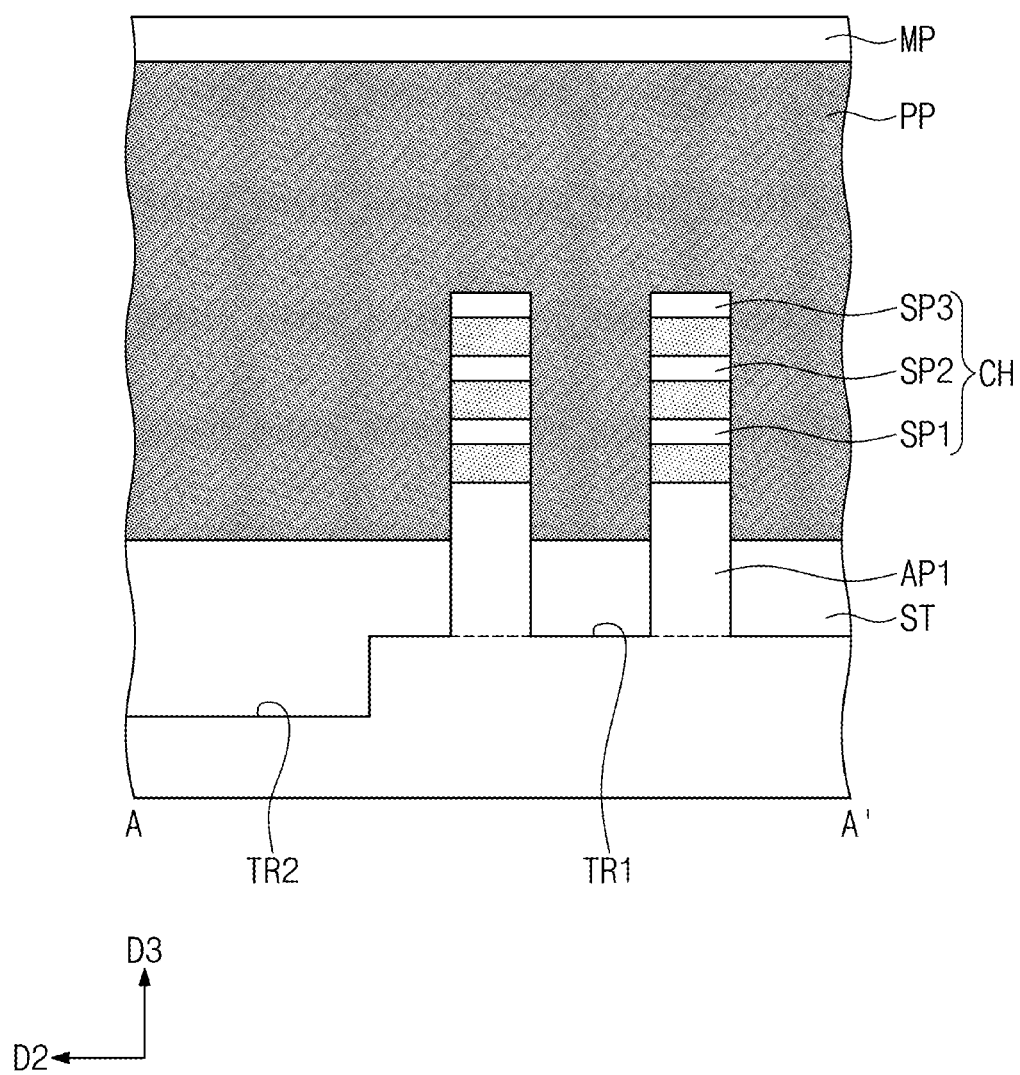
Figure 22B:
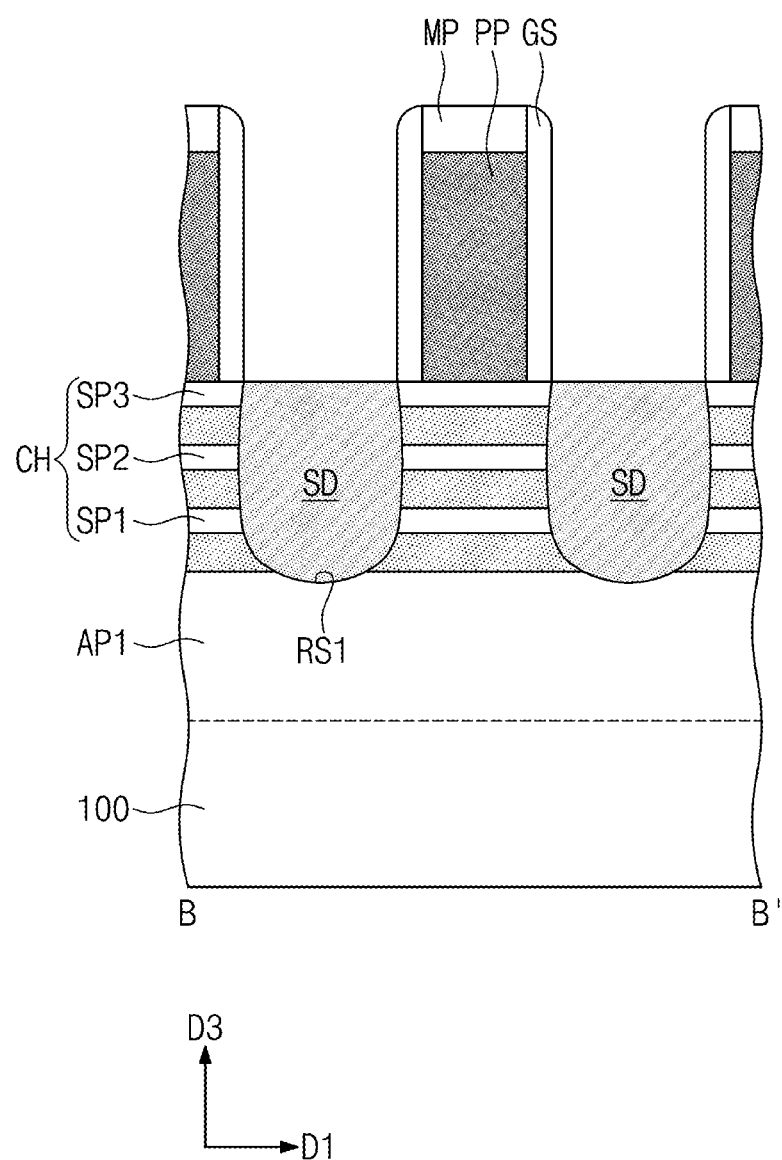
Figure 22C:
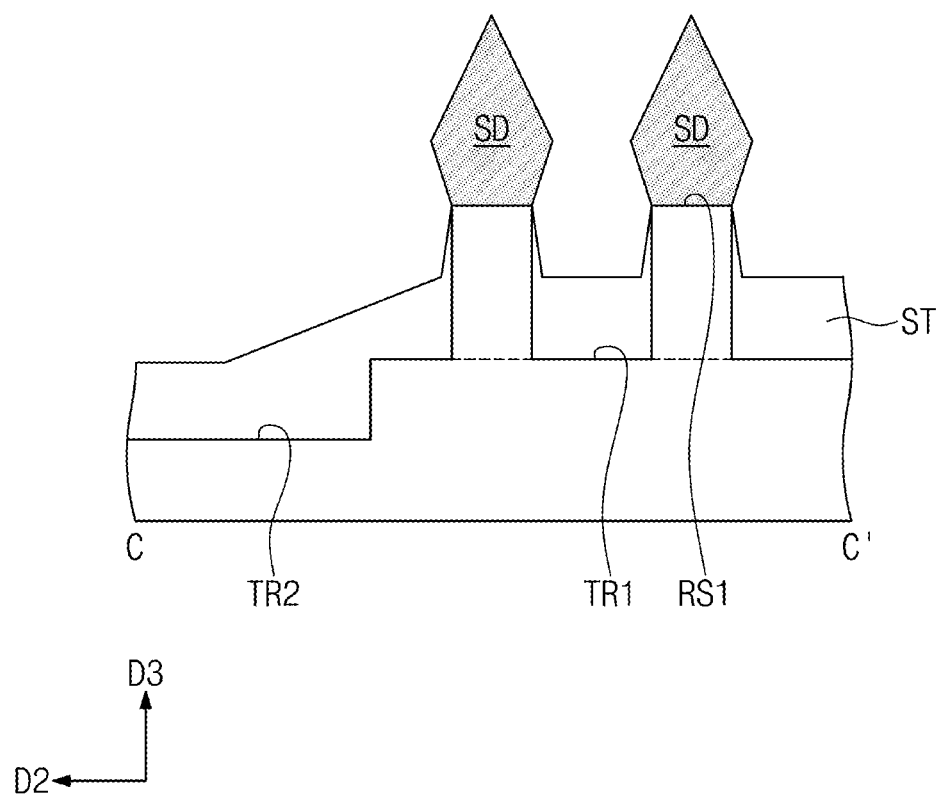
FIGS. 22C, 24C, and 27C illustrate cross-sectional views taken along line C-C' of FIGS. 21, 23, and 26, respectively.
Figure 23:
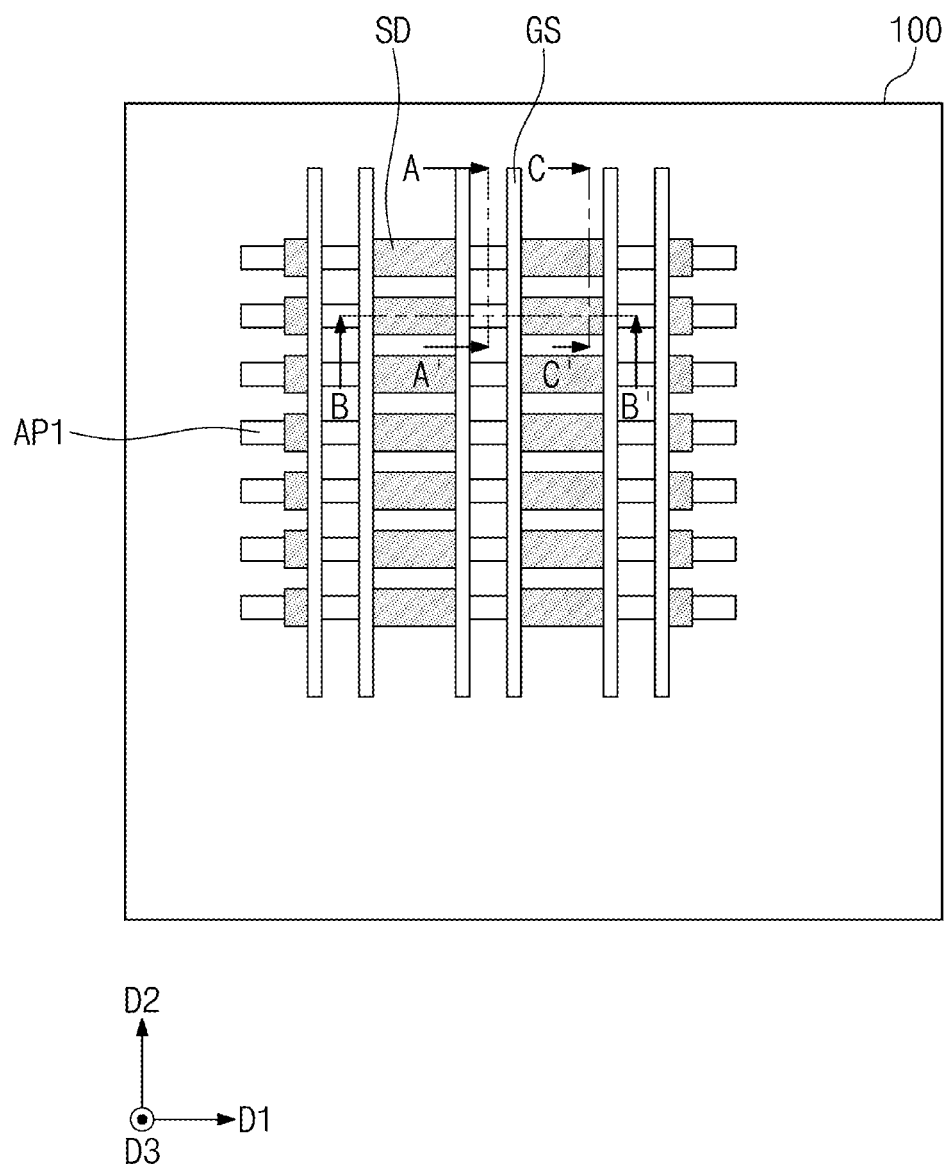

FIGS. 17, 19, 21, 23, and 26 illustrate plan views showing a method of fabricating a semiconductor device according to some example embodiments of the present inventive concepts. FIGS. 18, 20A, 22A, 24A, and 27A illustrate cross-sectional views taken along line A-A' of FIGS. 17, 19, 21, 23, and 26, respectively. FIGS. 20B, 22B, 24B, and 27B illustrate cross-sectional views taken along line B-B' of FIGS. 19, 21, 23, and 26, respectively. FIGS. 25 and 28 illustrate cross-sectional views taken along line B-B' of FIGS. 23 and 26, respectively. FIGS. 22C, 24C, and 27C illustrate cross-sectional views taken along line C-C' of FIGS. 21, 23, and 26, respectively.

Figure 17:
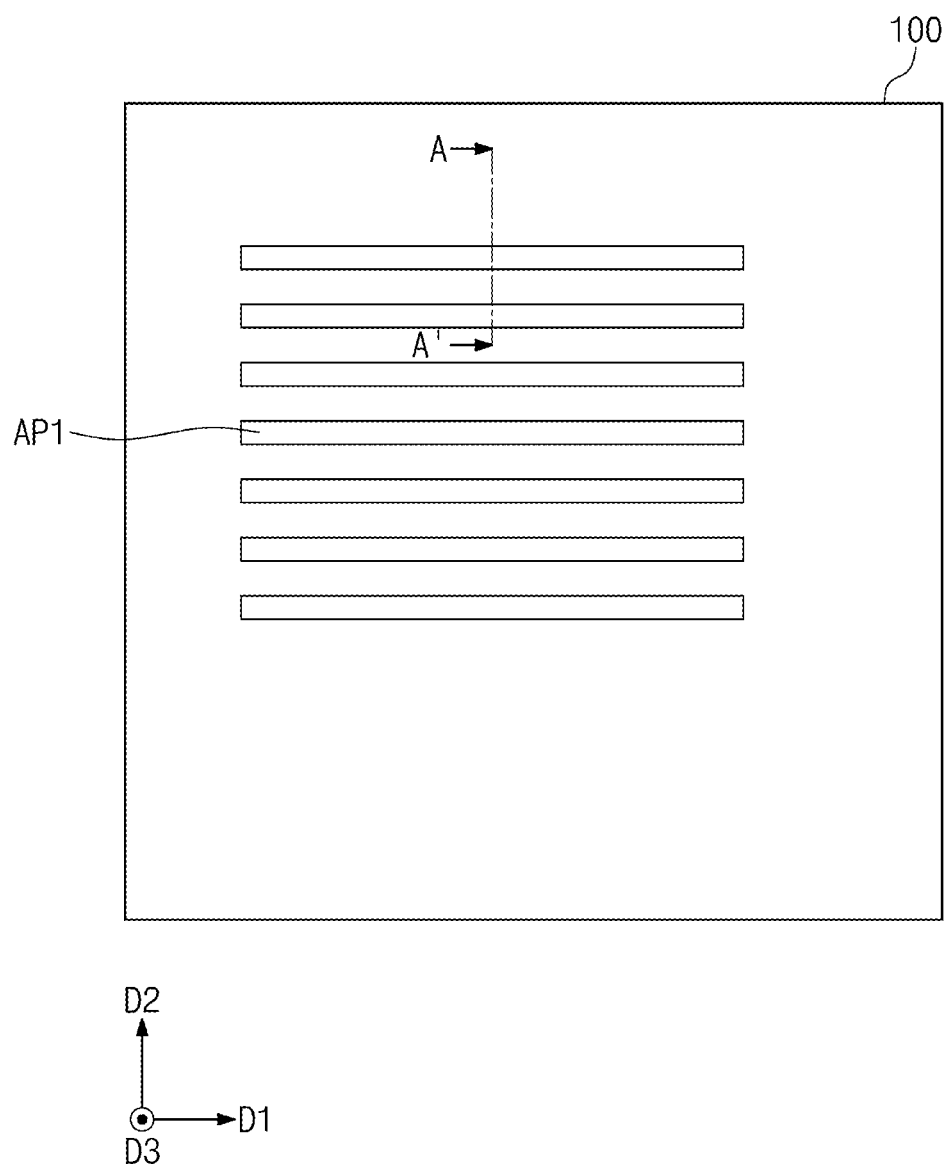
FIGS. 17, 19, 21, 23, and 26 illustrate plan views showing a method of fabricating a semiconductor device according to some example embodiments of the present inventive concepts.
Figure 18:
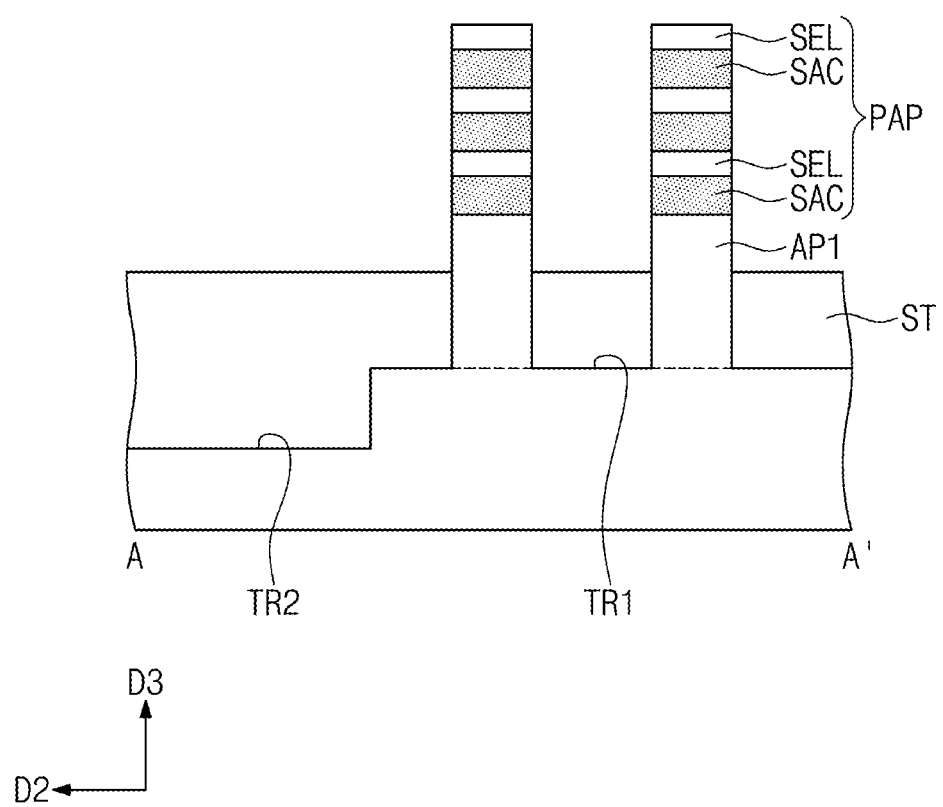
FIGS. 18, 20A, 22A, 24A, and 27A illustrate cross-sectional views taken along line A-A' of FIGS. 17, 19, 21, 23, and 26, respectively.

Referring to FIGS. 17 and 18, a substrate 100 may be provided which includes an active region. Sacrificial layers SAC and semiconductor layers SEL may be formed to be alternately stacked on the substrate 100. The substrate 100 may be patterned to form first active patterns AP1 on the active region. The first active patterns AP1 and the second active patterns (see AP2 of FIG. 15) may be formed as discussed above with reference to FIGS. 15 and 16. Thereafter, a photomask may be used to perform an etching process in which the second active patterns AP2 are etched and removed from the substrate 100.

The etching process may form a first trench TR1 between neighboring first active patterns AP1. A second trench TR2 may be formed between the first active pattern AP1 and the second active pattern AP2. For example, the second trench TR2 may have a depth greater than that of the first trench TR1.

A device isolation layer ST may be formed to fill the first trench TR1 and the second trench TR2. The device isolation layer ST may have a top surface lower than that of the first active pattern AP1.

When the first active pattern AP1 is patterned, the sacrificial layers SAC and the semiconductor layers SEL may also be patterned to form a preliminary pattern PAP on the first active pattern AP1. The preliminary pattern PAP may have a structure where the sacrificial layers SAC and the semiconductor layers SEL are alternately and repeatedly stacked. The sacrificial layers SAC may include a material having an etch selectivity with respect to the semiconductor layers SEL. In this sense, the semiconductor layers SEL may include a material that substantially cannot be etched in a process in which the sacrificial layers SAC are etched. For example, the sacrificial layers SAC may include silicon-germanium (SiGe) or germanium (Ge), and the semiconductor layers SEL may include silicon (Si).

Figure 19:
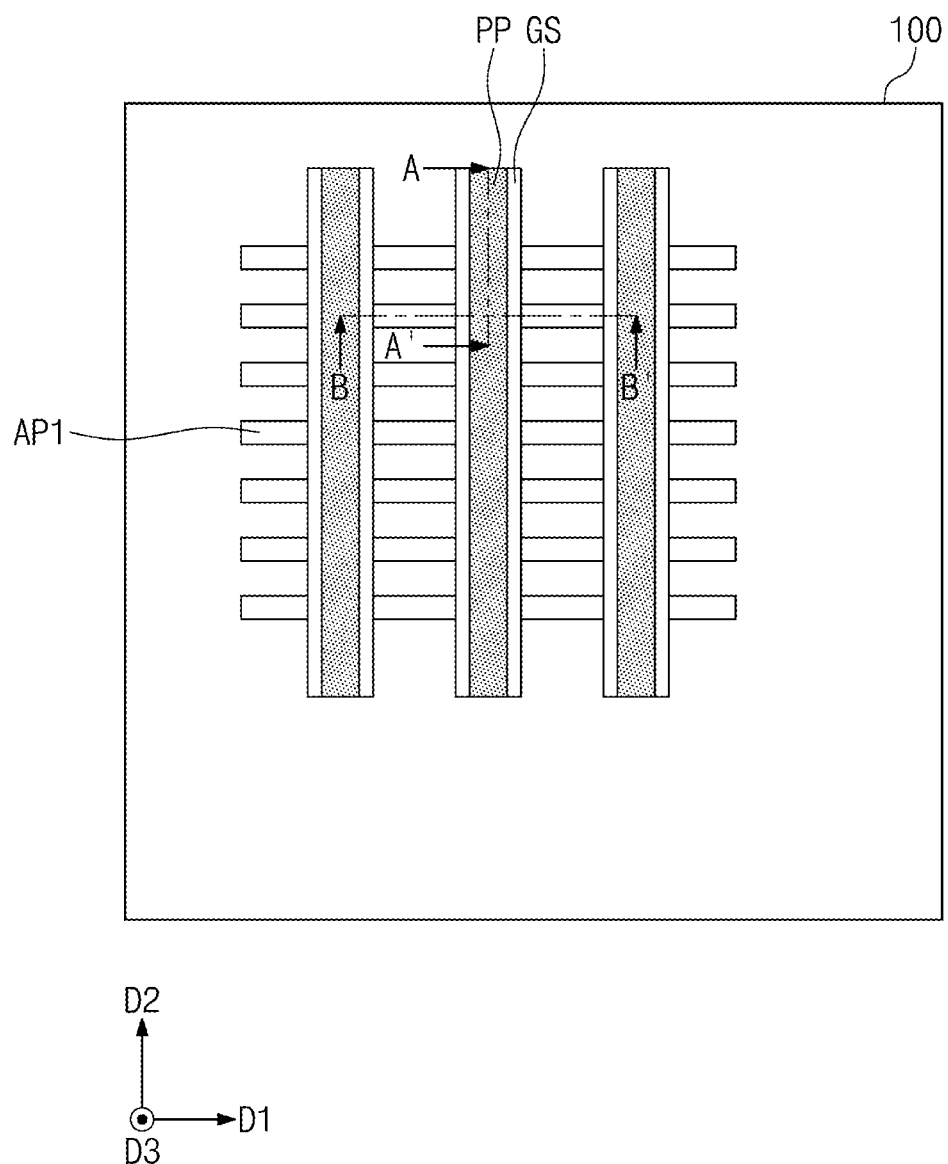
Figure 20A:
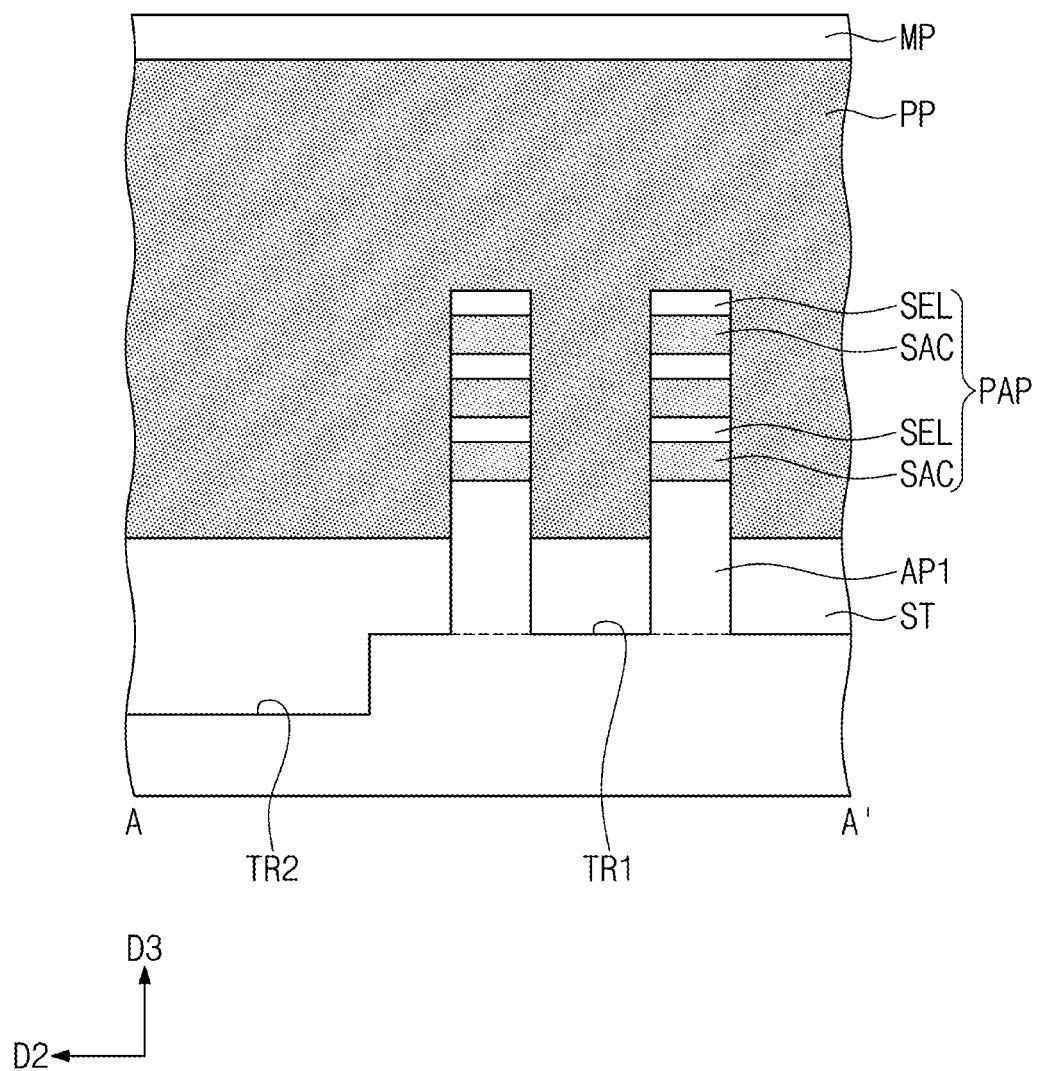
Figure 20B:
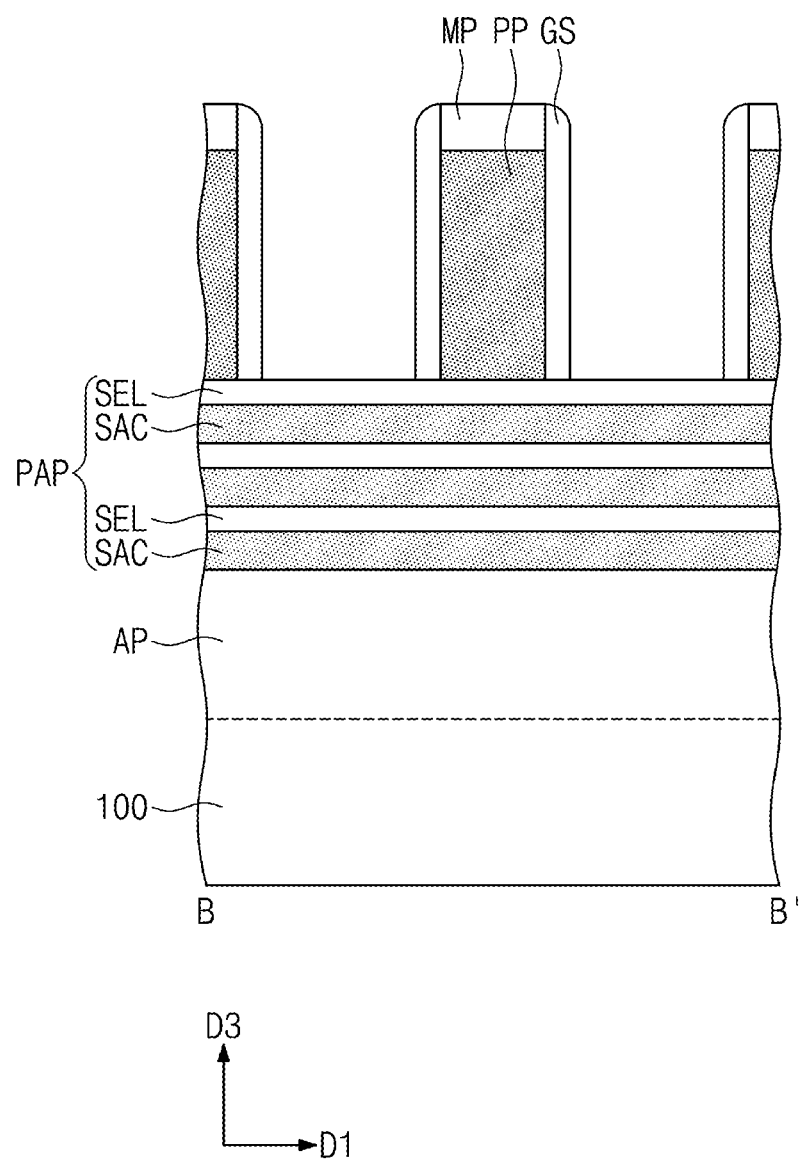
FIGS. 20B, 22B, 24B, and 27B illustrate cross-sectional views taken along line B-B' of FIGS. 19, 21, 23, and 26, respectively.
Figure 21:
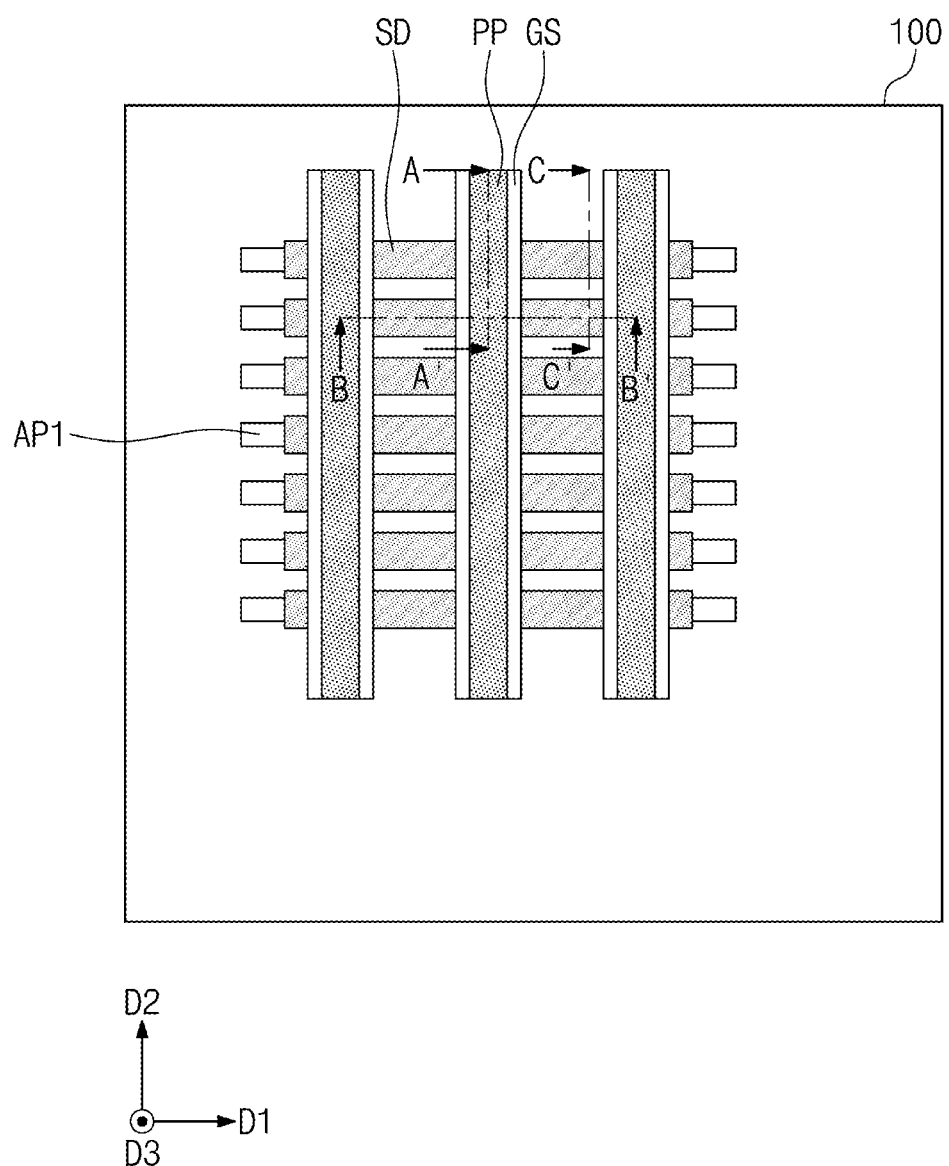

Referring to FIGS. 19, 20A, and 20B, sacrificial patterns PP may be formed to run across the preliminary pattern PAP. The sacrificial patterns PP may be formed to each have a linear or bar shape that extends in a second direction D2. The formation of the sacrificial patterns PP may include forming a sacrificial layer on the substrate 100, forming mask patterns MP on the sacrificial layer, and using the mask patterns MP as an etching mask to etch the sacrificial layer. The sacrificial layer may be formed of polysilicon. The mask patterns MP may be formed of a silicon oxide layer, a silicon nitride layer, or a silicon oxynitride layer.

A pair of gate spacers GS may be formed on opposite sidewalls of each of the sacrificial patterns PP. The formation of the gate spacers GS may include performing a deposition process, such as CVD or ALD, to form a spacer layer on an entire surface of the substrate 100, and performing an anisotropic etching process on the spacer layer. For example, the gate spacers GS may include one or more of SiCN, SiCON, and SiN.

Referring to FIGS. 21 and 22A to 22C, the mask patterns MP and the gate spacers GS may be used as an etching mask to etch the preliminary pattern PAP to form channel patterns CH. The semiconductor layers SEL of the preliminary pattern PAP may be patterned to form first, second, and third semiconductor patterns SP1, SP2, and SP3. Each of the channel patterns CH may include the first, second, and third semiconductor patterns SP1, SP2, and SP3 that are sequentially stacked.

The preliminary pattern PAP may be etched to form recesses RS1. The recess RS1 may be formed between a pair of neighboring channel patterns CH. Source/drain patterns SD may be formed to fill the recesses RS1. The formation of the source/drain patterns SD may include performing a selective epitaxial growth process in which the first active pattern AP1 and the first, second, and third semiconductor patterns SP1, SP2, and SP3 on the first active pattern AP1 are used as seed layers. The source/drain patterns SD may be formed of a material that provides compressive strain to the channel patterns CH. For example, the source/drain patterns SD may be formed of a semiconductor element (e.g., SiGe) whose lattice constant is greater than that of a semiconductor element of the substrate 100. Simultaneously with or after the selective epitaxial growth process, the source/drain patterns SD may be doped with p-type impurities.

Referring to FIGS. 23, 24A to 24C, and 25, a first interlayer dielectric layer 110 may be formed on the substrate 100. After that, a planarization process may be performed on the first interlayer dielectric layer 110 until top surfaces of the sacrificial patterns PP are exposed. The planarization process may include an etch-back process and/or a chemical mechanical polishing (CMP) process. When the first interlayer dielectric layer 110 is planarized, the mask patterns MP may also be removed. For example, the first interlayer dielectric layer 110 may be formed of, for example, a silicon oxide layer or a silicon oxynitride layer.

A removal process may be performed to selectively remove the sacrificial patterns PP that are exposed when the planarization process is carried out. The removal of the sacrificial patterns PP may form an empty space between a pair of neighboring gate spacers GS. The empty space may expose the sacrificial layers SAC and the first, second, and third semiconductor patterns SP1, SP2, and SP3.

A selective etching process may be performed to selectively remove the sacrificial layers SAC exposed to the empty space. For example, when the sacrificial layers SAC include silicon-germanium (SiGe), and when the first, second, and third semiconductor patterns SP1, SP2, and SP3 include silicon (Si), the selective etching process may use an etchant including peracetic acid. The etchant may further include hydrofluoric acid (HF) solution and deionized water.

The selective removal of the sacrificial layers SAC may define an empty space between a pair of vertically adjacent ones of the first, second, and third semiconductor patterns SP1, SP2, and SP3. For example, a first space may be defined between the first semiconductor pattern SP1 and the second semiconductor pattern SP2. A second space may be defined on an uppermost semiconductor pattern, or the third semiconductor pattern SP3. The empty space may include the first space and the second space.

The selective removal of the sacrificial layers SAC may allow the empty space to expose a top surface, a bottom surface, and sidewalls of each of the first, second, and third semiconductor patterns SP1, SP2, and SP3.

Figure 24A:
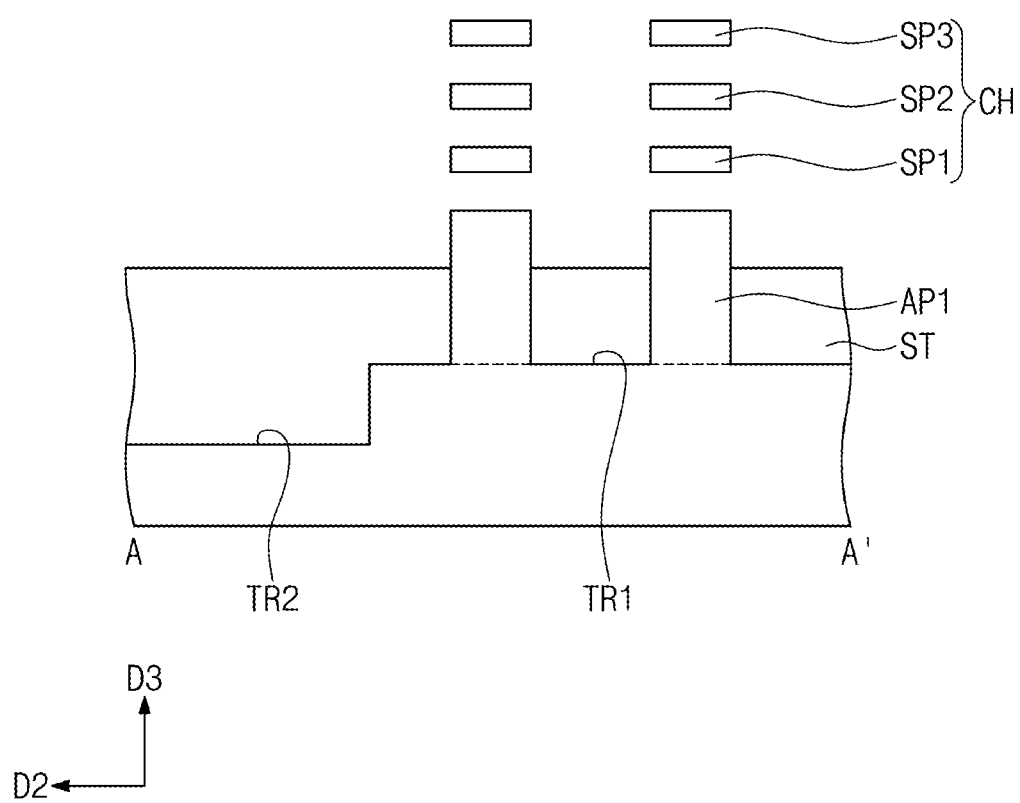
Figure 24B:
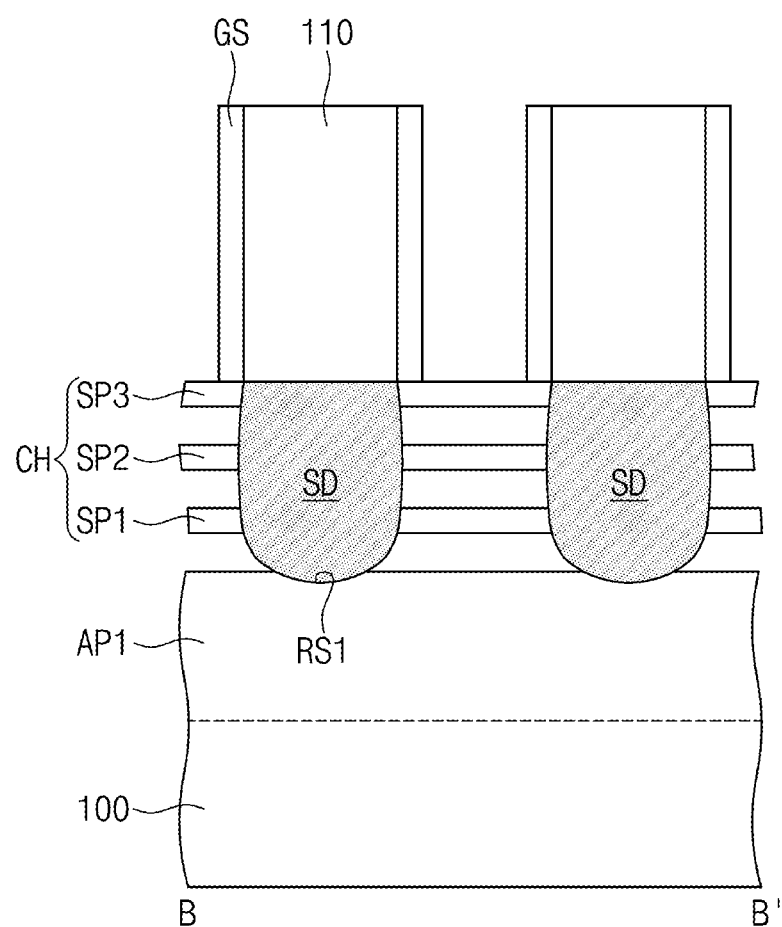
Figure 24C:
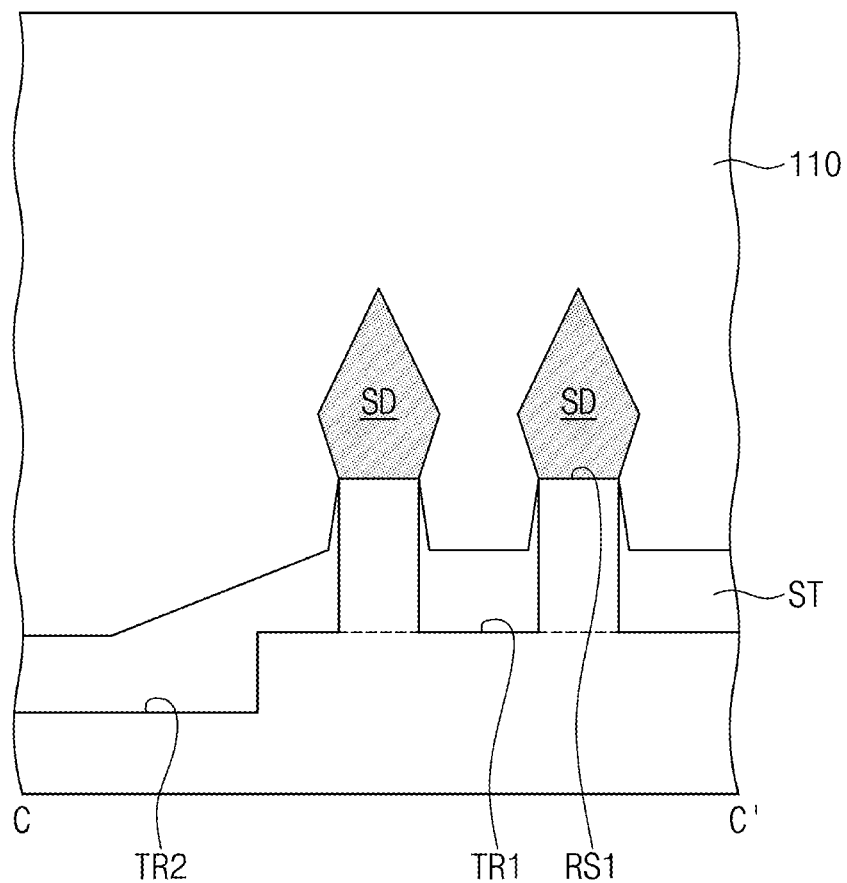
Figure 25:
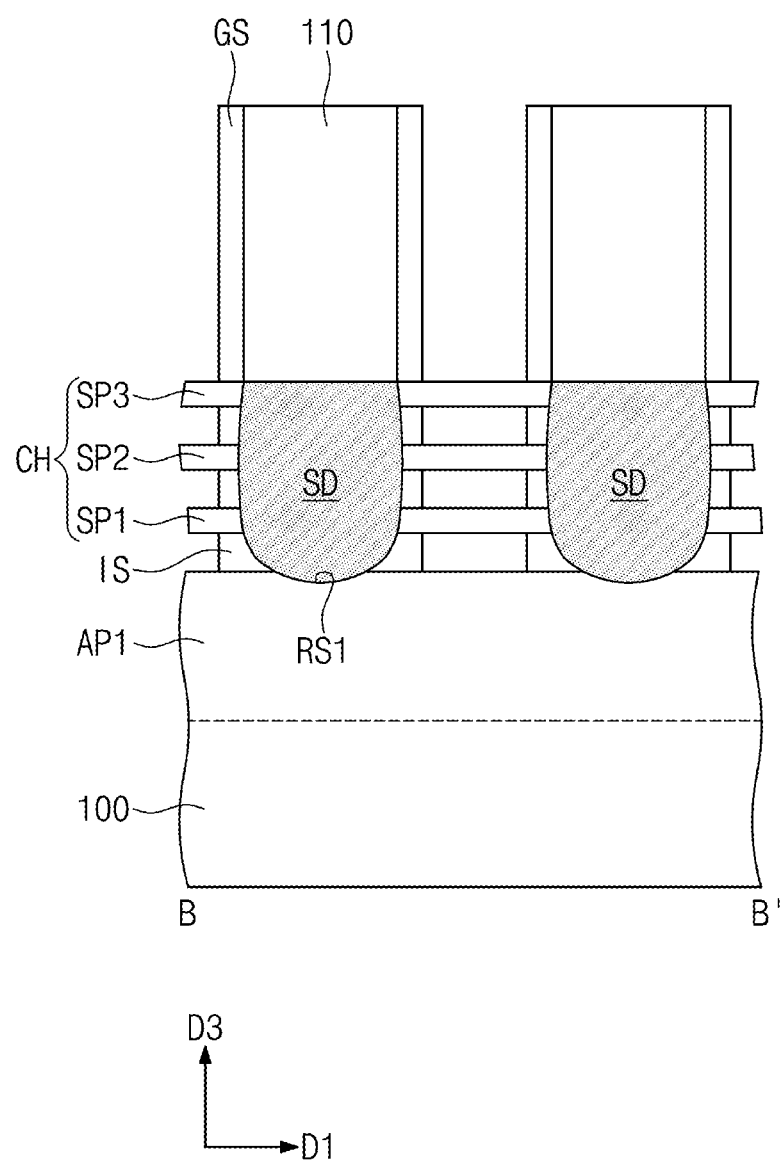
FIGS. 25 and 28 illustrate cross-sectional views taken along line B-B' of FIGS. 23 and 26, respectively.
Figure 26:
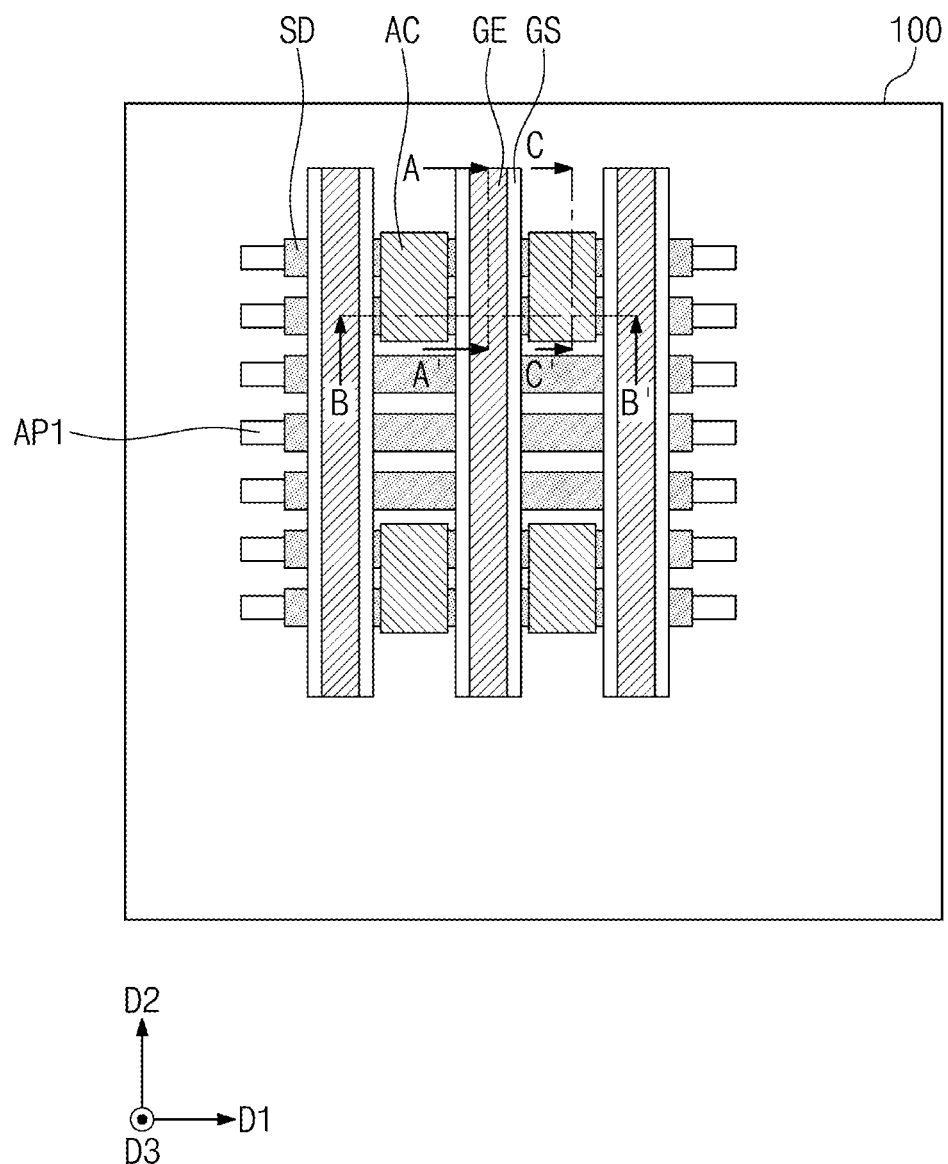

Referring back to FIG. 25, differently from that shown in FIG. 24B, a spacer IS may be formed between the first active pattern AP1 and the first semiconductor pattern SP1, between the first semiconductor pattern SP1 and the second semiconductor pattern SP2, and between the second semiconductor pattern SP2 and the third semiconductor pattern SP3. The spacer IS may be in contact with outer sidewalls of the source/drain patterns SD. The spacer IS may separate the source/drain patterns SD from a gate electrode GE which will be formed in a subsequent process.

Referring to FIGS. 26, 27A to 27C, and 28, a gate dielectric pattern GI may be formed in an empty space where the sacrificial pattern PP is removed. A gate electrode GE may be formed on the gate dielectric pattern GI, filling the empty space.

The gate dielectric pattern GI may be conformally formed by atomic layer deposition (ALD) and/or chemical oxidation. For example, the gate dielectric pattern GI may include a high-k dielectric material. For another example, the gate dielectric pattern GI may include a ferroelectric material. The formation of the gate electrode GE may include forming a gate electrode layer on the gate dielectric pattern GI and planarizing the gate electrode layer.

An upper portion of the gate electrode GE may be selectively etched to recess the gate electrode GE. The recessed gate electrode GE may have a top surface lower than that of the first interlayer dielectric layer 110 and those of the gate spacers GS. A gate capping pattern GP may be formed on the recessed gate electrode GE. The formation of the gate capping pattern GP may include forming a gate capping layer that covers the recessed gate electrode GE and planarizing the gate capping layer until the top surface of the first interlayer dielectric layer 110 is exposed. For example, the gate capping layer may include one or more of SiON, SiCN, SiCON, and SiN.

A second interlayer dielectric layer 120 may be formed on the first interlayer dielectric layer 110. The second interlayer dielectric layer 120 may include a silicon oxide layer or a low-k oxide layer. For example, the low-k oxide layer may include carbon-doped silicon oxide, such as SiCOH. The second interlayer dielectric layer 120 may be formed by chemical vapor deposition (CVD).

Contact holes may be formed to penetrate the second and first interlayer dielectric layers 120 and 110 and to expose the source/drain patterns SD. Active contacts AC may be formed to fill the contact holes. The active contact AC may include a conductive pattern FM and a barrier pattern BM that surrounds the conductive pattern FM. For example, the conductive pattern FM may include one or more of aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include one or more of titanium, tantalum, tungsten, nickel, cobalt, and platinum. The metal nitride layer may include one or more of titanium nitride (TiN), tantalum nitride (TaN), tungsten nitride (WN), nickel nitride (NiN), cobalt nitride (CoN), and platinum nitride (PtN).

With reference to FIGS. 26, 27A to 27C, and 28, the following will describe a semiconductor device fabricated by some embodiments of the present inventive concepts. In the embodiment that follows, omission will be made to avoid repetitive detailed descriptions about technical features discussed with reference to FIGS. 17 to 25C, and differences thereof will be discussed in detail.

Referring to FIGS. 26, 27A to 27C, and 28, a substrate 100 may be provided. For example, the substrate 100 may be a silicon substrate, a germanium substrate, or a silicon-on-insulator (SOI) substrate. A partial area of the substrate 100 may include a PMOSFET region and an NMOSFET region. The partial area of the substrate 100 may be a logic region. The logic region may include logic transistors that constitute a logic circuit.

The logic transistors may include first transistors on the PMOSFET region and second transistors on the NMOSFET region. The first transistors on the PMOSFET region may have their conductivity types different from those of the second transistors on the NMOSFET region. For example, the first transistors on the PMOSFET region may be PMOS-FETs, and the second transistors on the NMOSFET region may be NMOSFETs.

A device isolation layer ST may be provided on the substrate 100. The device isolation layer ST may define first active patterns AP1 on an upper portion of the substrate 100. The first active patterns AP1 may be disposed on the PMOSFET region or the NMOSFET region. The first active patterns AP1 may each have a linear or bar shape that extends in a first direction D1.

The device isolation layer ST may fill a first trench TR1 between a pair of neighboring first active patterns AP1. The device isolation layer ST may fill a second trench TR2 between the first active pattern AP1 and the second active pattern (see AP2 of FIG. 15). The second trench TR2 may have a depth greater than that of the first trench TR1. The device isolation layer ST may have a top surface lower than those of the first active patterns AP1.

Channel patterns CH and source/drain patterns SD may be provided on each of the first active patterns AP1. Each of the channel patterns CH may be interposed between a pair of neighboring source/drain patterns SD. Each of the channel patterns CH may include first, second, and third semiconductor patterns SP1, SP2, and SP3 that are sequentially stacked. The first, second, and third semiconductor patterns SP1, SP2, and SP3 may be spaced apart from each other in a third direction D3 perpendicular to a top surface of the substrate 100. The first, second, and third semiconductor patterns SP1, SP2, and SP3 may vertically overlap each other. Each of the source/drain patterns SD may be in direct contact with a sidewall of each of the first, second, and third semiconductor patterns SP1, SP2, and SP3. For example, the first, second, and third semiconductor patterns SP1, SP2, and SP3 may connect a pair of neighboring source/drain patterns SD to each other.

The first, second, and third semiconductor patterns SP1, SP2, and SP3 of the channel pattern CH may have the same thickness as each other or different thicknesses from each other. The first, second, and third semiconductor patterns SP1, SP2, and SP3 of the channel pattern CH may have different maximum lengths in a second direction D2. For example, a first length may refer to the maximum length in the second direction D2 of the first semiconductor pattern SP1. A second length may refer to the maximum length in the second direction D2 of the second semiconductor pattern SP2. The first length may be greater than the second length.

The first, second, and third semiconductor patterns SP1, SP2, and SP3 of the channel pattern CH may include one or more of silicon (Si), germanium (Ge), and silicon-germanium (SiGe). The channel pattern CH is exemplarily illustrated to include the first, second, and third semiconductor patterns SP1, SP2, and SP3, but the number of the semiconductor patterns is not limited thereto.

The first, second, and third semiconductor patterns SP1, SP2, and SP3 of the channel pattern CH and a recess of the first active pattern AP1 may serve as seed layers from which each of the source/drain patterns SD is epitaxially formed. Each of the source/drain patterns SD may fill the recess of the first active pattern AP1. The recess may be defined between neighboring channel patterns CH. The recess may have a bottom surface lower than the top surface of the first active pattern AP1.

The source/drain pattern SD may have a maximum width in the second direction D2 at a middle portion thereof. A width in the second direction D2 of the source/drain pattern SD may increase as approaching the middle portion from an upper portion of the source/drain pattern SD. The width in the second direction D2 of the source/drain pattern SD may decrease as approaching a lower portion of the source/drain pattern SD from the middle portion.

The source/drain patterns SD may be p-type impurity regions. The source/drain patterns SD may include a material that provides compressive strain to the channel pattern CH. When the source/drain patterns SD are p-type impurity regions, the source/drain patterns SD may include a semiconductor element (e.g., SiGe) whose lattice constant is greater than that of a semiconductor element of the substrate 100.

For another example, the source/drain patterns SD may be n-type impurity regions. When the source/drain patterns SD are n-type impurity regions, the source/drain patterns SD may include the same semiconductor element (e.g., Si) as that of the substrate 100. Gate electrodes GE may be provided to run across the channel patterns CH and to extend in the second direction D2. The gate electrodes GE may be spaced apart from each other in the first direction D1. The gate electrodes GE may vertically overlap the channel patterns CH.

Each of the gate electrodes GE may include a first metal pattern and a second metal pattern on the first metal pattern. The first metal pattern may be provided on a gate dielectric pattern GI which will be discussed below, thereby being adjacent to the channel patterns CH. The first metal pattern may include a work function metal that controls threshold voltage of a transistor. A thickness and composition of the first metal pattern may be adjusted to achieve a desired threshold voltage.

The first metal pattern may include metal nitride. For example, the first metal pattern may include nitrogen (N) and at least one metal which is selected from titanium (Ti), tantalum (Ta), aluminum (Al), tungsten (W), and molybdenum (Mo). The first metal pattern may further include carbon (C). The first metal pattern may include a plurality of work function metal layers that are stacked.

The second metal pattern may include metal whose resistance is lower than that of the first metal pattern. For example, the second metal pattern may include one or more of tungsten (W), aluminum (Al), titanium (Ti), and tantalum (Ta).

A pair of gate spacers GS may be disposed on opposite sidewalls of each of the gate electrodes GE. The gate spacers GS may extend in the second direction D2 along the gate electrodes GE. The gate spacers GS may have their top surfaces higher than those of the gate electrodes GE. The top surfaces of the gate spacers GS may be coplanar with that of a first interlayer dielectric layer 110 which will be discussed below. The gate spacers GS may include one or more of SiCN, SiCON, and SiN. Alternatively, the gate spacers GS may include a multi-layer including two or more of SiCN, SiCON, and SiN.

A gate capping pattern GP may be provided on each of the gate electrodes GE. The gate capping pattern GP may extend in the second direction D2 along the gate electrode GE. The gate capping pattern GP may include a material having an etch selectivity with respect to first and second interlayer dielectric layers 110 and 120 which will be discussed below. For example, the gate capping pattern GP may include one or more of SiON, SiCN, SiCON, and SiN.

A gate dielectric pattern GI may be interposed between the gate electrode GE and the first active pattern AP1. The gate dielectric pattern GI may extend along a bottom surface of the gate electrode GE that overlies the gate dielectric pattern GI. For example, the gate dielectric pattern GI may cover a top surface and a sidewall of the channel pattern CH. The gate dielectric pattern GI may cover the top surface of the device isolation layer ST below the gate electrode GE.

In some embodiments, the gate dielectric pattern GI may include a high-k dielectric material whose dielectric constant is greater than that of silicon oxide. For example, the high-k dielectric material may include one or more of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Figure 27A:
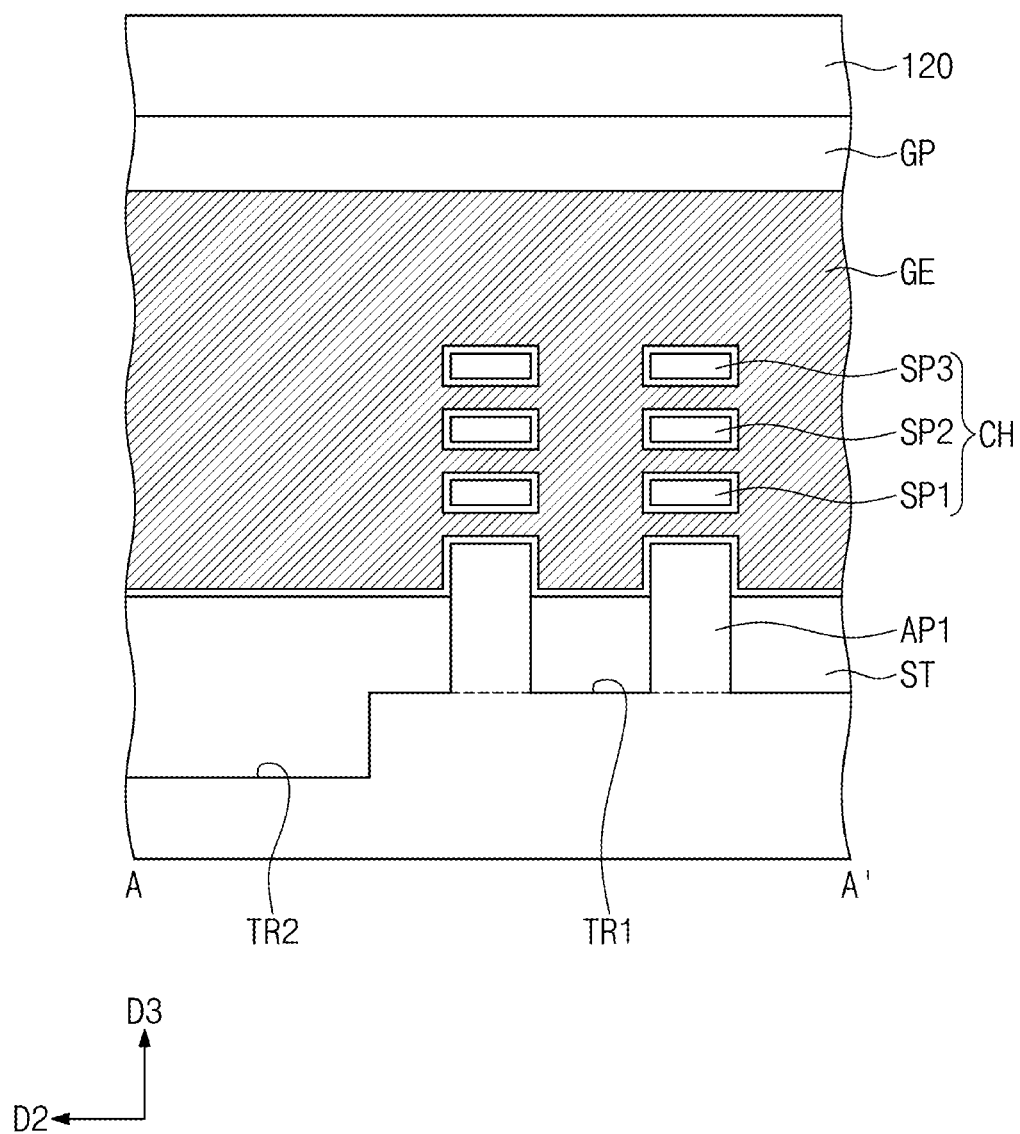
Figure 27B:
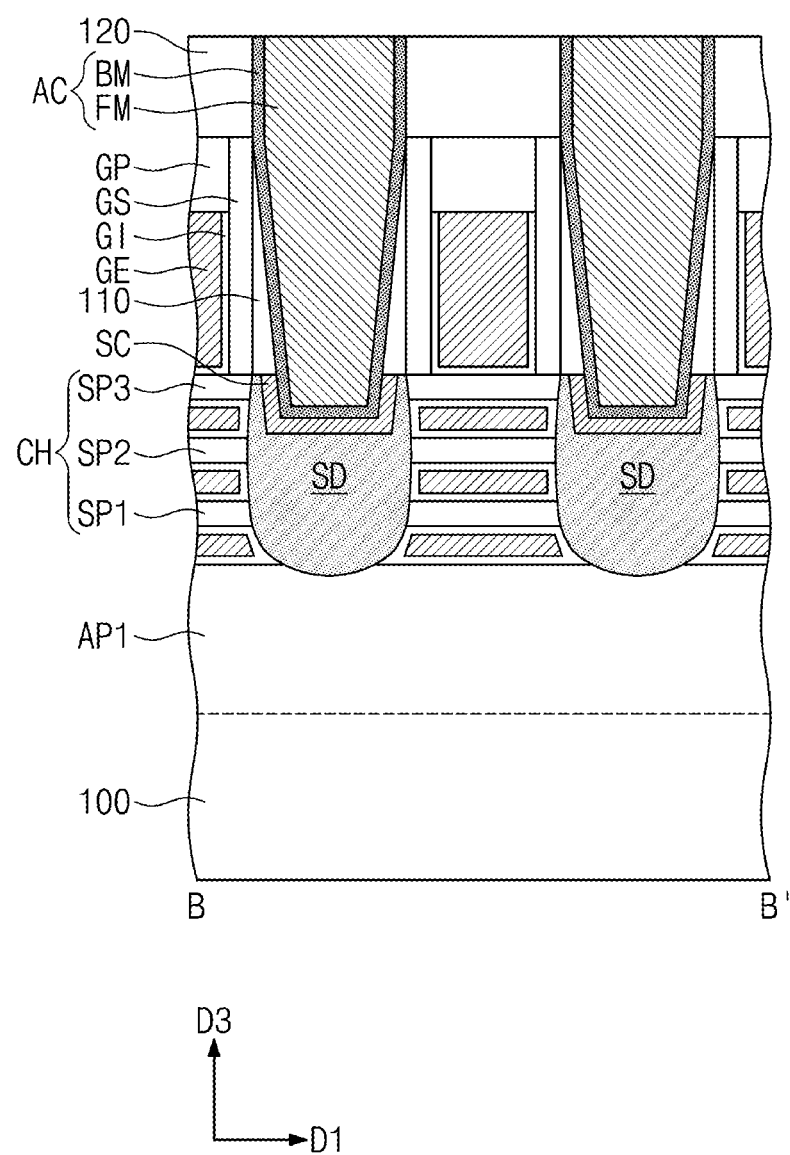
Figure 27C:
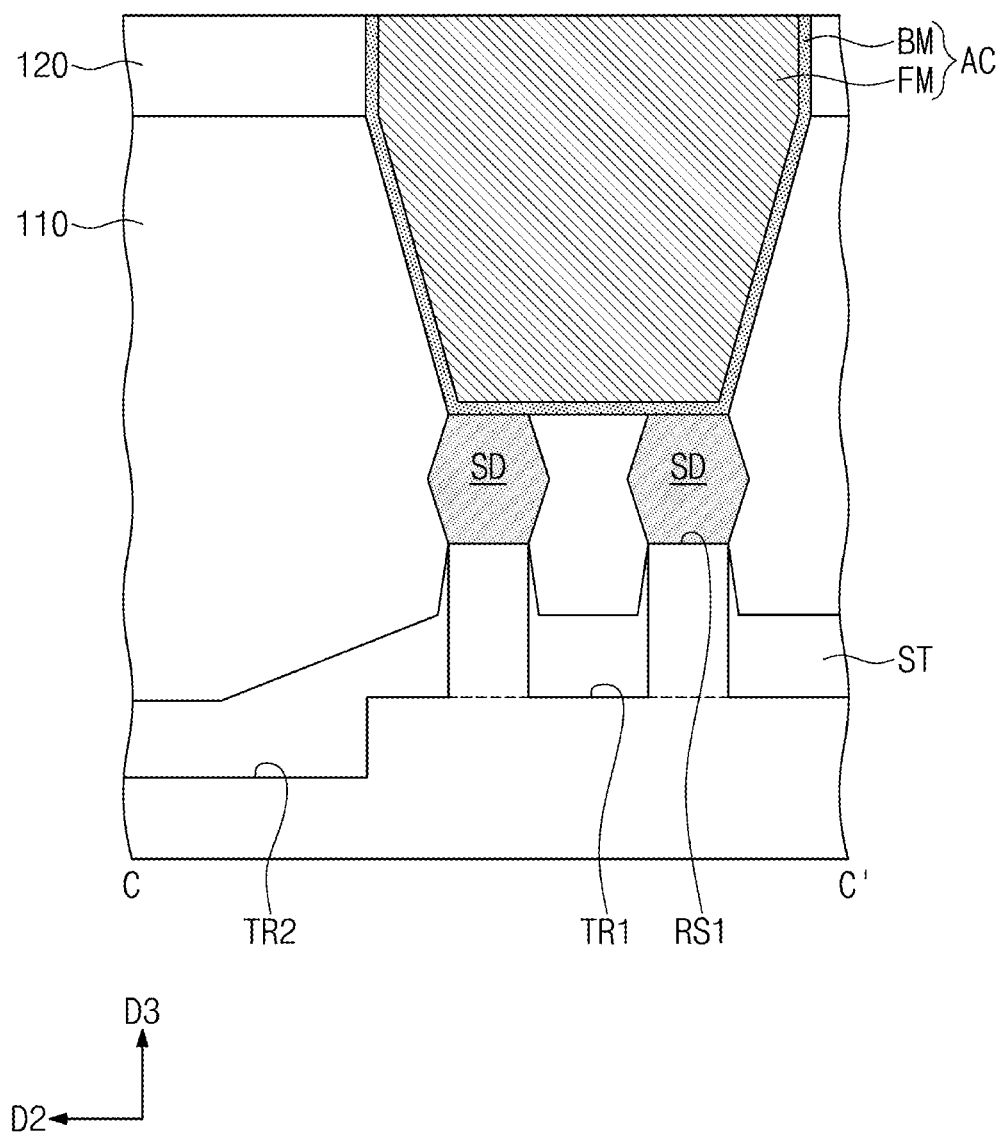
Figure 28:
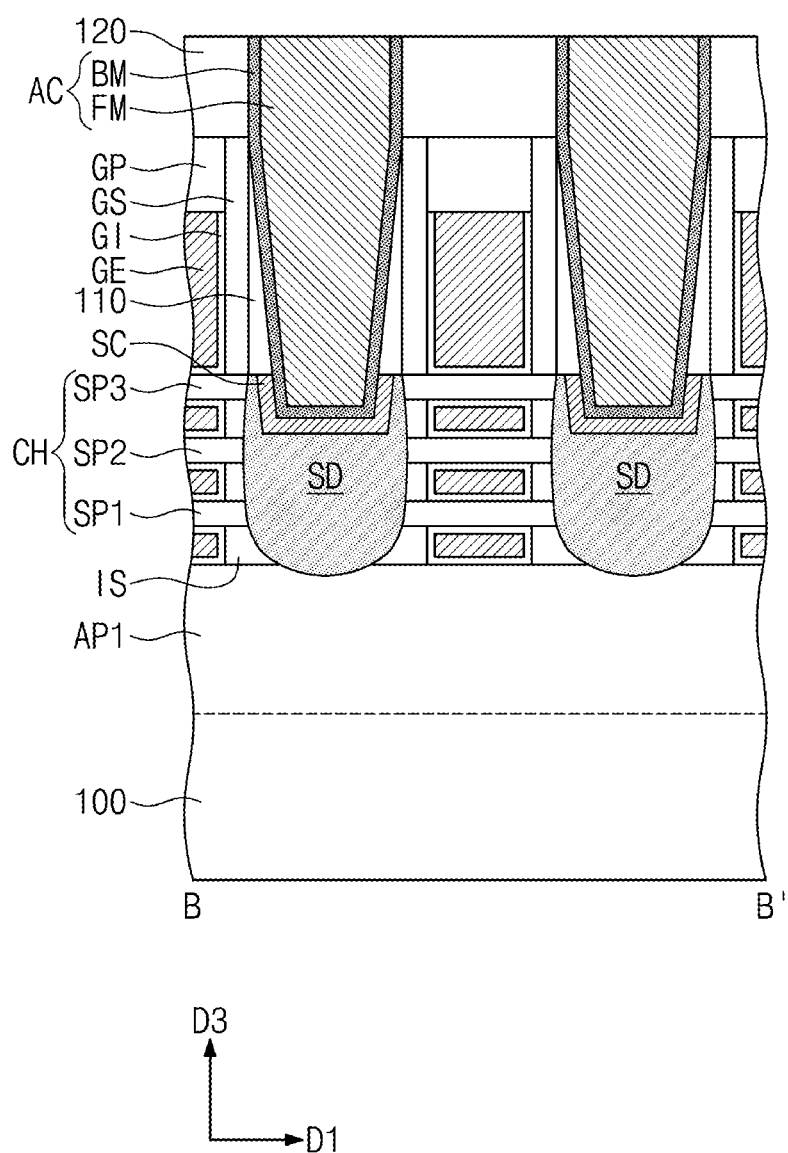

Referring back to FIG. 28, differently from that shown in FIG. 27B, a spacer IS may be formed between the first active pattern AP1 and the first semiconductor pattern SP1, between the first semiconductor pattern SP1 and the second semiconductor pattern SP2, and between the second semiconductor pattern SP2 and the third semiconductor pattern SP3. The spacer IS may separate the gate electrode GE from the source/drain patterns SD.

A first interlayer dielectric layer 110 may be provided on the substrate 100. The first interlayer dielectric layer 110 may cover the gate spacers GS and the source/drain patterns SD. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 that covers the gate capping patterns GP.

Active contacts AC may be provided to penetrate the first and second interlayer dielectric layers 110 and 120 and to have electrical connection with corresponding source/drain patterns SD. Each of the active contacts AC may be provided between a pair of gate electrodes GE. The active contact AC may be a self-aligned contact. For example, the gate capping pattern GP and the gate spacer GS may be used to form the active contact AC in a self-aligned manner. The active contact AC may cover, for example, at least a portion of a sidewall of the gate spacer GS. Although not shown, the active contact AC may partially cover the top surface of the gate capping pattern GP. The active contact AC may include a conductive pattern FM and a barrier pattern BM that surrounds the conductive pattern FM.

A silicide pattern SC may be interposed between the active contact AC and the source/drain pattern SD. The active contact AC may be electrically connected through the silicide pattern SC to the source/drain pattern SD. The silicide pattern SC may include metal silicide, for example, one or more of titanium silicide, tantalum silicide, tungsten silicide, nickel silicide, and cobalt silicide.

A transistor according to the present embodiment may be a three-dimensional field effect transistor (e.g. FinFET, MBCFET, or Vertical FET) in which the gate electrode GE three-dimensionally surrounds the channel patterns CH. Referring back to FIG. 27B, the gate electrode GE may surround a top surface, a bottom surface, and opposite sidewalls of each of the channel patterns CH. In this sense, a transistor according to the present embodiment may be a three-dimensional field effect transistor (e.g., MBCFET) in which the gate electrode GE three-dimensionally surrounds the channel patterns CH.

In a method of fabricating a semiconductor device according to the present inventive concepts, a pattern may be created on a low-density region having a low density of patterns on a layout, and thus it may be possible to improve uniformity of sizes of and distances between active patterns formed on a substrate. As a result, the semiconductor device may have improved electrical characteristics.

Although some example embodiments of the present inventive concepts have been discussed with reference to accompanying figures, it will be understood that various changes in form and details may be made therein without departing from the spirit and scope of the present inventive concepts. It will be apparent to those skilled in the art that various substitution, modifications, and changes may be thereto without departing from the scope and spirit of the present inventive concepts.

What is claimed is:

1. A method of fabricating a semiconductor device, comprising:
    placing on a first layout a plurality of first patterns that extend parallel to each other in a first direction and are spaced apart from each other in a second direction;
    extracting a low-density region on the first layout where the first patterns are placed;
    defining an enclosure region that surrounds at least some of the first patterns on the first layout;
    placing a plurality of dot patterns on a second layout;
    extracting a plurality of first dot patterns from the dot patterns on the second layout, which overlap the low-density region but not the enclosure region;
    placing the extracted first dot patterns on the first layout;
    extending the first dot patterns in the first direction to form a plurality of second patterns therefrom; and
    forming a plurality of first active patterns and a plurality of second active patterns on a substrate, from the first patterns and the second patterns, respectively.

2. The method of claim 1, wherein the low-density region is a section of the first layout; and wherein a density of the first pattern on the section is less than or equal to about 20%.

3. The method of claim 1, wherein a distance in the second direction between the first patterns is equivalent to a first distance; wherein a distance in the second direction between the second patterns is equivalent to a second distance; and wherein the first and second distances are substantially the same as each other.

4. The method of claim 3, wherein a fifth distance is provided between a boundary of the enclosure region and one of the first patterns adjacent to the boundary; and wherein fifth distance is greater than the first distance.

5. The method of claim 1, wherein the dot patterns are arranged as a two-dimensional array of dot patterns, which extend in the first and second directions.

6. The method of claim 1, wherein a length in the first direction of each of the dot patterns is substantially the same as a length in the second direction of each of the dot patterns.

7. The method of claim 1, wherein a spacing in the first direction between the dot patterns is equivalent to a third distance; wherein a spacing in the second direction between the dot patterns is equivalent to a fourth distance; and wherein the fourth distance is greater than the third distance.

8. The method of claim 1, wherein forming the first and second active patterns comprises manufacturing a first photomask using the first and second patterns on the first layout and then using the first photomask to perform a photolithography process on the substrate.

9. The method of claim 1, further comprising:
    forming, on a third layout, a mask pattern that covers the first patterns;
    manufacturing a second photomask using a third pattern on the third layout;
    performing a photolithography process on the substrate using the second photomask; and then
    etching the second active patterns.

10. The method of claim 9, wherein a size of the third pattern is substantially the same as a size of the enclosure region.

11. A method of fabricating a semiconductor device, comprising:
    generating a photomask based on a layout; and
    forming a plurality of active patterns on a substrate, using the photomask;
    wherein the layout is designed by:
        placing a plurality of first patterns that extend parallel to each other in a first direction on the layout, which includes a low-density region where the first patterns are not placed; and
        placing a plurality of second patterns that extend parallel to each other in the first direction, on the low-density region;
    wherein forming the plurality of active patterns includes using the first patterns and the second patterns of the layout to respectively form a plurality of first active patterns and a plurality of second active patterns on the substrate; and
    wherein the first patterns are spaced apart from each other in a second direction that intersects the first direction; wherein the second patterns are spaced apart from each other in the second direction; wherein a distance in the second direction between the first patterns equals a first distance; wherein a distance in the second direction between the second patterns equals a second distance; and wherein the first and second distances are substantially the same as each other.

12. The method of claim 11, wherein the layout includes an enclosure region that surrounds the first patterns.

13. The method of claim 12, wherein the enclosure region does not overlap the second patterns.

14. The method of claim 12, wherein a fifth distance is provided between a boundary of the enclosure region and one first pattern adjacent to the boundary; and wherein the fifth distance is greater than the first distance.

15. The method of claim 12, further comprising etching the second active patterns by forming on the layout a third pattern that covers the first patterns, and using the third pattern to etch the second active patterns.

16. The method of claim 15, wherein a size of the third pattern is substantially the same as a size of the enclosure region.

17. The method of claim 11, wherein the first active patterns are formed on an active region of the substrate; and wherein the active region is a PMOSFET region or an NMOSFET region.

18. The method of claim 17, further comprising forming a plurality of gate electrodes that run across the first active patterns and extend in a second direction intersecting the first direction.

19. The method of claim 18, wherein the first active pattern includes a plurality of channel patterns that are vertically stacked; and wherein the gate electrode is provided on a top surface, a bottom surface, and opposite sidewalls of each of the channel patterns.

* * * * *